(12) United States Patent
Seo et al.

(10) Patent No.: US 9,123,907 B2
(45) Date of Patent: *Sep. 1, 2015

(54) LIGHT-EMITTING ELEMENT

(71) Applicant: Semiconductor Energy Laboratory Co., Ltd., Atsugi-shi, Kanagawa-ken (JP)

(72) Inventors: Satoshi Seo, Sagamihara (JP); Satoko Shitagaki, Isehara (JP); Nobuharu Ohsawa, Atsugi (JP); Hideko Inoue, Atsugi (JP); Hiroshi Kadoma, Sagamihara (JP); Harue Osaka, Sagamihara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.
This patent is subject to a terminal disclaimer.

(21) Appl. No.: 14/285,754

(22) Filed: May 23, 2014

(65) Prior Publication Data
US 2014/0252338 A1 Sep. 11, 2014

Related U.S. Application Data

(63) Continuation of application No. 13/433,508, filed on Mar. 29, 2012, now Pat. No. 8,736,157.

(30) Foreign Application Priority Data
Apr. 7, 2011 (JP) ................................ 2011-085423

(51) Int. Cl.
H05B 33/14 (2006.01)
H01L 51/50 (2006.01)
(Continued)

(52) U.S. Cl.
CPC ............ H01L 51/5028 (2013.01); C09K 11/06 (2013.01); H01L 51/5024 (2013.01);
(Continued)

(58) Field of Classification Search
CPC .................................................. H01L 51/5028
USPC ............ 313/498–512; 315/169.3; 345/36, 45, 345/76
See application file for complete search history.

(56) References Cited

U.S. PATENT DOCUMENTS
5,409,783 A 4/1995 Tang et al.
(Continued)

FOREIGN PATENT DOCUMENTS
CN 001656853 A 8/2005
(Continued)

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.
(Continued)

Primary Examiner — Nimeshkumar Patel
Assistant Examiner — Christopher Raabe
(74) Attorney, Agent, or Firm — Eric J. Robinson; Robinson Intellectual Property Law Office, P.C.

(57) ABSTRACT

To provide a light-emitting element with high emission efficiency or long lifetime, in which the use amount of a phosphorescent compound is small. To provide a light-emitting element including a light-emitting layer between a pair of electrodes, wherein the light-emitting layer includes a phosphorescent compound, a first organic compound, and a second organic compound, and the combination of the first organic compound and the second organic compound forms an exciplex. The light-emitting element transfers energy by utilizing the overlap between the emission spectrum of the exciplex and the absorption spectrum of the phosphorescent compound and thus has high energy transfer efficiency, even when the concentration of the phosphorescent compound is low.

33 Claims, 16 Drawing Sheets

(51) Int. Cl.
*C09K 11/06* (2006.01)
*H01L 51/00* (2006.01)

(52) U.S. Cl.
CPC ........ *H05B33/14* (2013.01); *C09K 2211/1007* (2013.01); *C09K 2211/1044* (2013.01); *C09K 2211/185* (2013.01); *H01L 51/0072* (2013.01); *H01L 51/0074* (2013.01); *H01L 51/0085* (2013.01); *H01L 51/5016* (2013.01)

(56) References Cited

U.S. PATENT DOCUMENTS

| | | | |
|---|---|---|---|
| 5,420,288 | A | 5/1995 | Ohta et al. |
| 5,597,890 | A | 1/1997 | Jenekhe |
| 5,597,925 | A | 1/1997 | Ohta et al. |
| 5,610,309 | A | 3/1997 | Ohta et al. |
| 5,656,401 | A | 8/1997 | Ohta et al. |
| 5,709,492 | A | 1/1998 | Yasunaga et al. |
| 6,097,147 | A | 8/2000 | Baldo et al. |
| 6,863,997 | B2 | 3/2005 | Thompson et al. |
| 6,869,695 | B2 | 3/2005 | Thompson et al. |
| 6,951,694 | B2 | 10/2005 | Thompson et al. |
| 7,175,922 | B2 | 2/2007 | Jarikov et al. |
| 7,183,010 | B2 | 2/2007 | Jarikov |
| 7,553,557 | B2 | 6/2009 | Thompson et al. |
| 7,572,522 | B2 | 8/2009 | Seo et al. |
| 7,943,925 | B2 | 5/2011 | Yamazaki |
| 8,247,086 | B2 | 8/2012 | Inoue et al. |
| 2003/0124381 | A1 | 7/2003 | Thompson et al. |
| 2003/0175553 | A1 | 9/2003 | Thompson et al. |
| 2004/0076853 | A1 | 4/2004 | Jarikov |
| 2005/0048310 | A1 | 3/2005 | Cocchi et al. |
| 2005/0106415 | A1 | 5/2005 | Jarikov et al. |
| 2005/0196775 | A1 | 9/2005 | Swager et al. |
| 2006/0024526 | A1 | 2/2006 | Thompson et al. |
| 2006/0134464 | A1 | 6/2006 | Nariyuki |
| 2006/0228577 | A1 | 10/2006 | Nagara |
| 2007/0222374 | A1 | 9/2007 | Egawa et al. |
| 2007/0244320 | A1 | 10/2007 | Inoue et al. |
| 2008/0160345 | A1 | 7/2008 | Inoue et al. |
| 2008/0286604 | A1 | 11/2008 | Inoue et al. |
| 2010/0052527 | A1 | 3/2010 | Ikeda et al. |
| 2010/0145044 | A1 | 6/2010 | Inoue et al. |
| 2010/0184942 | A1 | 7/2010 | Chen et al. |
| 2011/0001146 | A1 | 1/2011 | Yamazaki et al. |
| 2011/0204353 | A1 | 8/2011 | Yamazaki |
| 2011/0210316 | A1 | 9/2011 | Kadoma et al. |
| 2011/0215714 | A1 | 9/2011 | Seo et al. |
| 2012/0098417 | A1 | 4/2012 | Inoue et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0242219 | A1 | 9/2012 | Seo et al. |
| 2012/0248421 | A1 | 10/2012 | Yamazaki et al. |
| 2012/0267618 | A1 | 10/2012 | Monkman et al. |
| 2013/0002131 | A1* | 1/2013 | Inoue et al. ................... 313/504 |
| 2013/0048964 | A1 | 2/2013 | Takeda et al. |

FOREIGN PATENT DOCUMENTS

| | | |
|---|---|---|
| CN | 101442107 A | 5/2009 |
| CN | 102190653 A | 9/2011 |
| EP | 0669387 A | 8/1995 |
| EP | 1359790 A | 11/2003 |
| EP | 2363398 A | 9/2011 |
| EP | 2366753 A | 9/2011 |
| JP | 06-065569 A | 3/1994 |
| JP | 06-092947 A | 4/1994 |
| JP | 06-107648 A | 4/1994 |
| JP | 06-145658 A | 5/1994 |
| JP | 07-085972 A | 3/1995 |
| JP | 07-288184 A | 10/1995 |
| JP | 2003-347058 A | 12/2003 |
| JP | 2005-514754 | 5/2005 |
| JP | 2007-073620 A | 3/2007 |
| JP | 2010-080435 A | 4/2010 |
| JP | 2010-135689 A | 6/2010 |
| JP | 2011-153269 A | 8/2011 |
| JP | 2011-201869 A | 10/2011 |
| JP | 2011-204673 A | 10/2011 |
| JP | 2011-216628 A | 10/2011 |
| JP | 2012-004526 A | 1/2012 |
| JP | 2013-509670 | 3/2013 |
| KR | 2010-0027073 A | 3/2010 |
| KR | 2011-0099173 A | 9/2011 |
| KR | 2011-0099645 A | 9/2011 |
| TW | 200514834 | 5/2005 |
| WO | WO-00/70655 | 11/2000 |
| WO | WO-03/059015 | 7/2003 |
| WO | WO-2005/040303 | 5/2005 |
| WO | WO-2010/085676 | 7/2010 |
| WO | WO-2011/042443 | 4/2011 |

OTHER PUBLICATIONS

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.
International Search Report (Application No. PCT/JP2012/058770) Dated Jul. 10, 2012.
Written Opinion (Application No. PCT/JP2012/058770) Dated Jul. 10, 2012.
Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.
Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.
Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.
Baldo.M et al., "Prospects for Electrically Pumped Organic Lasers", Phys. Rev. B (Physical Review. B), Jul. 1, 2002, vol. 66, pp. 035321-1-035321-16.
Gu.G et al., "Transparent Organic Light Emitting Devices", Appl. Phys. Lett. (Applied Physics Letters), May 6, 1996, vol. 68, No. 19, pp. 2606-2608.
Baldo.M et al., "Highly Efficient Phosphorescent Emission From Organic Electroluminescent Devices", Nature, Sep. 10, 1998, vol. 395, pp. 151-154.
Kondakova.M et al., "High-efficiency, low-voltage phosphorescent organic light-emitting diode devices with mixed host", J. Appl. Phys. (Journal of Applied Physics), 2008, vol. 104, pp. 094501-1-094501-17.
Seo.J et al., "Efficient blue-green organic light-emitting diodes based on heteroleptic tris-cyclometalated iridium(III) complexes", Thin Solid Films, 2009, vol. 517, No. 5, pp. 1807-1810.
King.K et al., "Excited-state properties of a triply ortho-metalated iridium(III) complex", J. Am. Chem. Soc. (Journal of the American Chemical Society), Mar. 1, 1985, vol. 107, No. 5, pp. 1431-1432, ACS(American Chemical Society).
Hino.Y et al., "Red Phosphorescent Organic Light-Emitting Diodes Using Mixture System of Small-Molecule and Polymer Host", Jpn. J. Appl. Phys. (Japanese Journal of Applied Physics), 2005, vol. 44, No. 4B, pp. 2790-2794.
Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.
Chinese Office Action (Application No. 201280022226.0) Dated Jun. 30, 2015.

* cited by examiner

FIG. 6    Current vs. Voltage
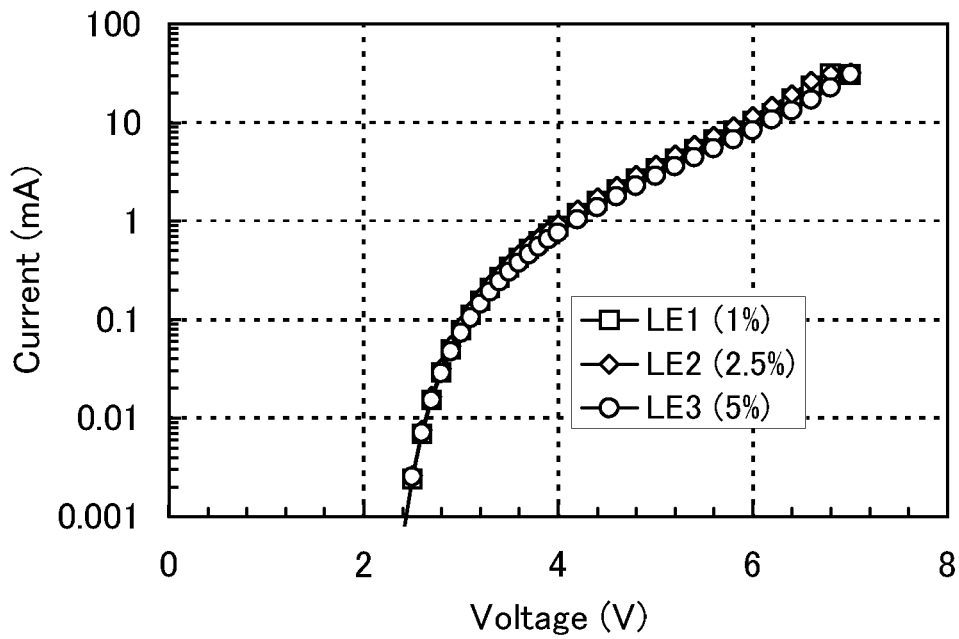
FIG. 7    Chromaticity vs. Luminance
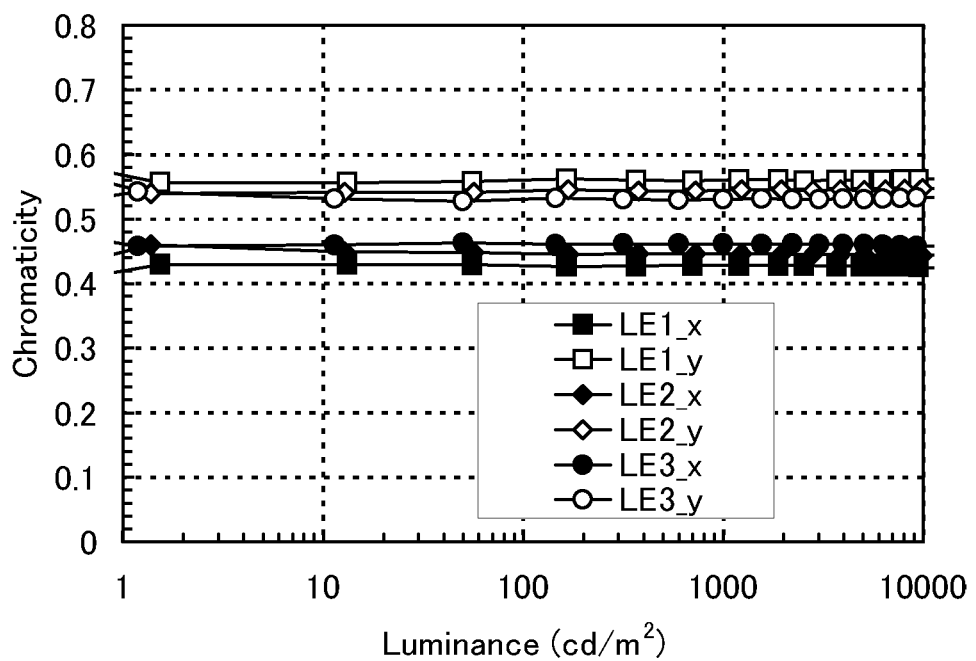

FIG. 24    Current efficiency vs. Luminance
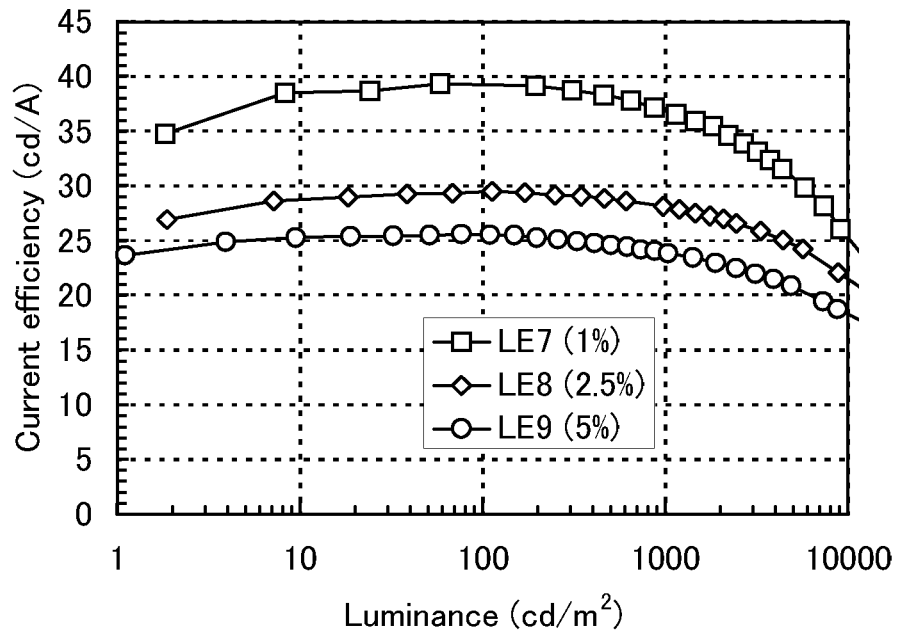
FIG. 25    Power efficiency vs. Luminance
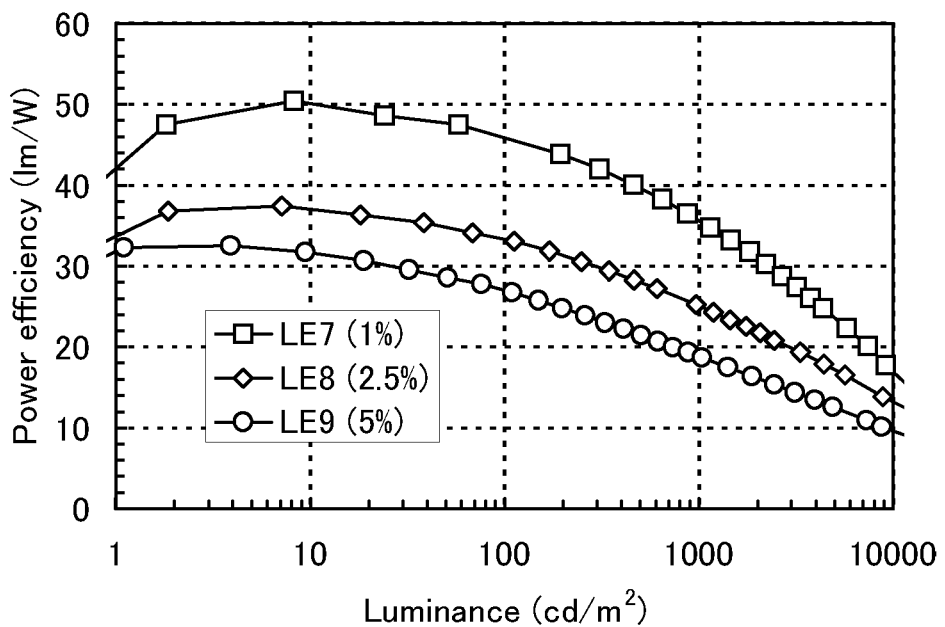

LIGHT-EMITTING ELEMENT

TECHNICAL FIELD

The present invention relates to light-emitting elements utilizing organic electroluminescence (EL) (hereinafter, also referred to as organic EL elements).

BACKGROUND ART

Organic EL elements have been keenly studied and developed (see, Patent Documents 1 and 2 and Non-Patent Document 1). In a fundamental structure of the organic EL element, a layer containing a light-emitting organic compound (hereinafter also referred to as light-emitting layer) is interposed between a pair of electrodes. The organic EL element has attracted attentions as a next-generation flat panel display element owing to characteristics such as feasibility of being thinner and lighter, high speed response to input signals, and capability of direct current low voltage driving.

In addition, a display using such a light-emitting element has a feature that it is excellent in contrast and image quality, and has a wide viewing angle. Further, since an organic EL element is a plane light source, it is considered that the light-emitting element is applied as a light source such as a backlight of a liquid crystal display and a lighting device.

The light-emission mechanism of organic EL elements is a carrier-injection system. That is, by application of voltage with a light-emitting layer interposed between electrodes, electrons and holes injected from the electrodes are recombined to make a light-emitting substance excited, and light emitted when the excited state returns to a ground state. There are two types of the excited states which are possible: a singlet excited state ($S^*$) and a triplet excited state ($T^*$). In addition, the statistical generation ratio thereof in a light-emitting element is considered to be $S^*:T^*=1:3$.

In general, the ground state of a light-emitting organic compound is a singlet state. Thus, light emission from the singlet excited state ($S^*$) is referred to as fluorescence because it is caused by electron transition between the same spin multiplicities. On the other hand, light emission from a triplet excited state ($T^*$) is referred to as phosphorescence where electron transition occurs between different spin multiplicities. Here, in a compound emitting fluorescence (hereinafter referred to as fluorescent compound), in general, phosphorescence is not observed at room temperature, and only fluorescence is observed. Accordingly, the internal quantum efficiency (the ratio of generated photons to injected carriers) in a light-emitting element using a fluorescent compound is assumed to have a theoretical limit of 25% based on $S^*:T^*=1:3$.

On the other hand, when a compound emitting phosphorescence (hereinafter referred to as phosphorescent compound) is used, an internal quantum efficiency of 100% can be theoretically achieved. In other words, higher emission efficiency can be obtained than that when a fluorescent compound is used. Therefore, the light-emitting element using a phosphorescent compound has been actively developed in recent years in order to achieve a highly efficient light-emitting element. As the phosphorescent compound, in particular, an organometallic complex that has iridium or the like as a central metal has particularly attracted attentions because of its high phosphorescence quantum yield; for example, an organometallic complex that has iridium as a central metal is disclosed as a phosphorescent material in Patent Document 1.

When a light-emitting layer of a light-emitting element is formed using a phosphorescent compound described above, in order to inhibit concentration quenching or quenching due to triplet-triplet annihilation in the phosphorescent compound, the light-emitting layer is often formed such that the phosphorescent compound is dispersed in a matrix of another compound. Here, the compound forming the matrix is called host, and the compound dispersed in the matrix, such as a phosphorescent compound, is called guest (or a dopant).

In addition, Patent Document 2 or Non-Patent Document 1 describes a method for forming a light-emitting layer with use of a mixture of a material with a high electron-transport property and a material with a high hole-transport property. For example, in Non-Patent Document 1, a light-emitting device is proposed, in which two materials of a tris(8-quinolinolato)aluminum complex (abbreviation: $Alq_3$) with a high electron-transport property and 4,4'-bis[N-(1-naphthyl)-N-phenylamino]biphenyl (abbreviation: NPB) with a high hole-transport property and methylquinacridon (abbreviation: mqa) as a guest (dopant) are used.

In the light-emitting layer having such a structure, two kinds of hosts have separate functions, so that electrons and holes can be transferred with good balance. In other words, electrons are transferred by $Alq_3$ and holes are transferred by NPB and the electrons and holes reach mqa, so that mqa can be excited. Only fluorescence is emitted from mqa, but in Patent Document 2 discloses that light emission from a triplet excited state can be obtained by using a phosphorescent compound as a guest.

REFERENCE

[Patent Document 1] PCT International Publication No. 2000/070655

[Patent Document 2] Specification of U.S. Pat. No. 7,572,522

Non-Patent Document

[Non-Patent Document 1] Vi-En Choong et al., "Organic light-emitting diodes with a bipolar transport layer", Appl. Phys. Lett., 75, 172 (1999).

DISCLOSURE OF INVENTION

Iridium is a rare element (or minor metal) (Clarke number is $1\times10^{-7}\%$) and the deposit of iridium near the earth's surface is smaller than the deposits of platinum (Clarke number is $5\times10^{-7}\%$) and gold (Clarke number is $5\times10^{-7}\%$) which are more expensive than iridium. Thus, there is a concern about the steady supply of iridium, and the use amount is desired to be small.

However, in general, when a phosphorescent compound is a guest and the concentration of the guest is extremely lowered, the emission efficiency is decreased. This is explained as follows. There are considered to be roughtly two processes in making a guest molecule excited. One is a direct recombination process in which an electron and a hole are injected into a guest molecule so that the guest molecule is excited. The other is an energy transfer process in which a state of an excited host molecule is transferred to a guest molecule.

In order to increase the ratio of the direct recombination process, the concentration of guests should be high. Accordingly, if the concentration of guests is decreased, the recombination probability is also decreased and thus the emission efficiency is decreased.

On the other hand, as for the energy transfer process, there are proposed two theories: Förster mechanism and Dexter mechanism.

Förster mechanism (also referred to as Förster resonance energy transfer) does not require direct contact between molecules for energy transfer. It is considered that through a resonant phenomenon of dipolar oscillation between a host molecule and a guest molecule, energy is transferred. By the resonant phenomenon of dipolar oscillation, a host molecule provides energy to a guest molecule, and thus, the host molecule is put in a ground state and the guest molecule is put in an excited state. The rate constant $k_{h^* \to g}$ of Förster mechanism is expressed by Formula (1).

[Formula 1]

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \quad (1)$$

In Formula (1), v denotes a frequency, $f'_h(v)$ denotes a normalized emission spectrum of a host molecule (a fluorescent spectrum in energy transfer from a singlet excited state, and a phosphorescent spectrum in energy transfer from a triplet excited state), $\varepsilon_g(v)$ denotes a molar absorption coefficient of a guest molecule, N denotes Avogadro's number, n denotes a refractive index of a medium, R denotes an intermolecular distance between a host molecule and a guest molecule, τ denotes a measured lifetime of an excited state (fluorescent lifetime or phosphorescent lifetime), c denotes light speed, φ denotes a luminescence quantum efficiency (a fluorescent quantum efficiency in energy transfer from a singlet excited state, and a phosphorescent quantum efficiency in energy transfer from a triplet excited state), and $K^2$ denotes a coefficient (0 to 4) of orientation of a transition dipole moment between a host molecule and a guest molecule. Note that $K^2=2/3$ in random orientation.

In Dexter mechanism (also referred to as Dexter electron transfer), it is considered that a host molecule and a guest molecule are close to a contact effective range where their orbitals overlap, and the host molecule in an excited state and the guest molecule in a ground state exchange their electrons, which leads to energy transfer. The rate constant $k_{h^* \to g}$ of Dexter mechanism is expressed by Formula (2).

[Formula 2]

$$k_{h^* \to g} = \left(\frac{2\pi}{h}\right) K^2 \exp\left(-\frac{2R}{L}\right) \int f'_h(v)\varepsilon'_g(v) dv \quad (2)$$

In Formula (2), h denotes a Planck constant, K denotes a constant having an energy dimension, v denotes a frequency, $f'_h(v)$ denotes a normalized emission spectrum of a host molecule (a fluorescent spectrum in energy transfer from a singlet excited state, and a phosphorescent spectrum in energy transfer from a triplet excited state), $\varepsilon'_g(v)$ denotes a normalized absorption spectrum of a guest molecule, L denotes an effective molecular radius, and R denotes an intermolecular distance between a host molecule and a guest molecule.

In general, the possible distance of energy transfer due to Dexter mechanism is about 1 nm or less, while the possible distance of energy transfer due to Förster mechanism is about 10 nm or less. Therefore, when the concentration of guests is small and the distance between a guest molecule and an excited host molecule is large, the energy transfer efficiency is extremely decreased. For that reason, the concentration of guests needs to be 3% or higher.

As described above, in consideration of an elementary process from carrier recombination to formation of an excited guest, the concentration of guests should be high in order to put a guest in an excited state efficiently. However, if the concentration of guests is high, a decrease in emission efficiency due to clumping of guests, that is, concentration quenching occurs and thus the emission efficiency of the element is decreased as a result, even if the guests are put in excited states efficiently. In other words, if the concentration of guests is low, the generation efficiency of excited guests is low, whereas if the concentration of guests is high, concentration quenching occurs. In either case, there is a dilemma that the emission efficiency is decreased.

In view of the problems, it is an object of one embodiment of the present invention to provide a light-emitting element with a lowered concentration of guests by using a novel emission mechanism. Further, it is an object of one embodiment of the present invention to provide a light-emitting device with high efficiency. Furthermore, it is an object of one embodiment of the present invention to provide a light-emitting device with a long lifetime. Moreover, it is an object of one embodiment of the present invention to provide a light-emitting device with less deterioration. Moreover, it is an object of one embodiment of the present invention to provide a light-emitting device with high reliability. One embodiment of the present invention can achieve at least one of the objects.

One embodiment of the present invention is a light-emitting element having a light-emitting layer including a phosphorescent compound, a first organic compound, and a second organic compound between a pair of electrodes, and the first organic compound and the second organic compound form an exciplex, and the ratio of the weight of the phosphorescent compound to the total weight of the first organic compound and the second organic compound is from 0.1% to 2.5%, preferably from 0.1% to 1.5%, more preferably from 0.1% to 0.5%.

Another embodiment of the present invention is a light-emitting element having a light-emitting layer including a phosphorescent compound, a first organic compound, and a second organic compound between a pair of electrodes, and at least one first organic compound and at least one second organic compound form an exciplex, the exciplex acts on the phosphorescent compound so that the phosphorescent compound can emit phosphorescence, and the ratio of the weight of the phosphorescent compound to the total weight of the first organic compound and the second organic compound is from 0.1% to 2.5%, preferably from 0.1% to 1.5%, more preferably from 0.1% to 0.5%.

Another embodiment of the present invention is a light-emitting element having a light-emitting layer including a phosphorescent compound, a first organic compound, and a second organic compound between a pair of electrodes, an exciplex of the first organic compound and the second organic compound is formed from a singlet exciton of the first organic compound or the second organic compound, and the ratio of the weight of the phosphorescent compound to the total weight of the first organic compound and the second organic compound is from 0.1% to 2.5%, preferably from 0.1% to 1.5%, more preferably from 0.1% to 0.5%.

Another embodiment of the present invention is a light-emitting element having a light-emitting layer including a phosphorescent compound, a first organic compound, and a second organic compound between a pair of electrodes, an exciplex of the first organic compound and the second organic compound is formed from an anion of the first organic compound and a cation of the second organic compound, and the ratio of the weight of the phosphorescent compound to the total weight of the first organic compound and the second organic compound is from 0.1% to 2.5%, preferably from 0.1% to 1.5%, more preferably from 0.1% to 0.5%.

In any of the aforementioned light-emitting elements, the excitation energy of the exciplex is preferably transferred to the phosphorescent compound so that the phosphorescent compound emits phosphorescence.

In any of the aforementioned light-emitting elements, at least one of the first organic compound and the second organic compound is preferably a fluorescent compound.

In any of the aforementioned light-emitting elements, the phosphorescent compound is preferably an organometallic complex containing iridium.

In any of the aforementioned light-emitting elements, the molar absorption coefficient of the phosphorescent compound at a peak of an emission spectrum of the exciplex is preferably 5000 $M^{-1}cm^{-1}$ or more.

In any of the aforementioned light-emitting elements, preferably, the first organic compound has an electron-transport property higher than a hole-transport property, while the second organic compound has a hole-transport property higher than an electron-transport property.

The light-emitting element in accordance with one embodiment of the present invention can be applied to a light-emitting device, an electronic device, and a lighting device.

In the energy transfer process described above, the efficiency of energy transfer from a host molecule to a guest molecule (energy transfer efficiency $\Phi_{ET}$) is thought to be expressed by Formula (3). In the formula, $k_r$ denotes a rate constant of a light-emission process of a host molecule (fluorescence in energy transfer from a singlet excited state of a host molecule, and phosphorescence in energy transfer from a triplet excited state of a host molecule), $k_n$ denotes a rate constant of a non-light-emission process (thermal deactivation or intersystem crossing), and $\tau$ denotes a measured lifetime of an excited state of a host molecule.

[Formula 3]

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

First, according to Formula (3), it is found that the energy transfer efficiency $\Phi_{ET}$ can be increased by further increasing the rate constant $k_{h^* \to g}$ of energy transfer as compared with another competing rate constant $k_r+k_n(=1/\tau)$. Then, in order to increase the rate constant $k_{h^* \to g}$ of energy transfer, based on Formulae (1) and (2), in Förster mechanism and Dexter mechanism, it is preferable that an emission spectrum of a host molecule (a fluorescent spectrum in energy transfer from a singlet excited state, and a phosphorescent spectrum in energy transfer from a triplet excited state) largely overlap with an absorption spectrum of a guest molecule.

In addition, it is found that energy is transferred more easily from a host molecule to a guest molecule, as the absorptive power of the guest molecule at the emission peak of the host molecule is higher.

In other words, the energy level of an excited state of a host molecule and the energy level of an excited state of a guest molecule are set to be substantially equal and the transition probability of the guest molecule into an excited state is increased, thereby contributing to easier energy transfer.

However, under this condition, when a single material is used as a host in a conventional manner, the energy of an excited guest molecule is easily transferred to a host molecule in a ground state, which leads to a decrease of emission efficiency as a result.

This problem can be solved with use of an exciplex. Exciplex will be described now. The exciplex (excited complex) is formed by an interaction between dissimilar molecules in excited states. The exciplex is generally known to be easily formed between a material having a relatively deep LUMO (LUMO: Lowest Unoccupied Molecular Orbital) level and a material having a relatively shallow HOMO (HOMO: Highest Occupied Molecular Orbital) level.

Here, the HOMO levels and LUMO levels of a first organic compound and a second organic compound used in one embodiment of the present invention are different from each other. Specifically, the energy levels are higher in the following order: HOMO level of a first organic compound<HOMO level of a second organic compound<LUMO level of the first organic compound<LUMO level of the second organic compound.

However, even if this condition is satisfied, an exciplex is not necessarily formed, for example, $Alq_3$ and NPB in Non-Patent Document 1 do not form an exciplex. Note that the following effects cannot be obtained when no exciplex is formed.

When an exciplex is formed by a first organic compound and a second organic compound, the LUMO level and the HOMO level of the exciplex originate from the first organic compound and the second organic compound, respectively. Therefore, the energy difference of the exciplex is smaller than the energy difference of the first organic compound and the energy difference of the second organic compound. In other words, the emission wavelength of the exciplex is located on the longer wavelength side than the emission wavelengths of the first organic compound and the second organic compound.

The formation process of the exciplex is considered to be roughly classified into the following two processes. A first process is formation of an electroplex. In this specification, the term "electroplex" means that a first organic compound in the ground state and a second organic compound in the ground state directly form an exciplex. Specifically, when an anion of a first organic compound and a cation of a second organic compound are adjacent, the both form an exciplex.

From the above relation, in the case where the first organic compound is a compound having an electron-trapping property and the second organic compound is a compound having a hole-trapping property, an electroplex is formed directly from an anion of the first organic compound and a cation of the second organic compound.

The emission spectrum of the electroplex formed is located on the longer wavelength side than the emission wavelength of each of the first and second organic compounds.

The overlap between the emission spectrum of the electroplex and the absorption spectrum of the phosphorescent compound is larger than the overlap between the emission spectrum of the first organic compound (or the second organic compound) and the absorption spectrum of the phosphorescent compound. The light-emitting element in accordance with one embodiment of the present invention transfers energy by utilizing the overlap between the emission spectrum of the exciplex and the absorption spectrum of the phosphorescent compound as a guest and thus has high energy transfer efficiency. Therefore, in accordance with one embodiment of the present invention, a light-emitting element having high external quantum efficiency can be obtained.

As described above, in general, when an electron and a hole are recombined in a host material, excitation energy is transferred from the host molecule in an excited state to a guest molecule, whereby the guest molecule is put in an excited state to emit light.

At this time, before the excitation energy is transferred from the host molecule to the guest molecule, the host molecule itself emits light in a non-desired wavelength or the excitation energy turns into thermal energy, which leads to partial loss of the excitation energy (deactivation). In particular, when the host molecule is in a singlet excited state, excitation life is shorter than that when it is in a triplet excited state, which easily leads to deactivation of a singlet exciton. The deactivation of exciton is one of causes for decrease in lifetime of a light-emitting element.

However, in accordance with one embodiment of the present invention, an electroplex is formed from a first organic compound and a second organic compound having carriers (cation or anion); therefore, formation of a singlet exciton having a short excitation lifetime can be suppressed. In other words, there can be a process where an exciplex is directly formed without formation of a singlet exciton. Thus, deactivation of the singlet exciton can be inhibited. Accordingly, a light-emitting element having a long lifetime can be obtained.

It is a novel concept to obtain a light-emitting element having high emission efficiency by suppressing the generation of the singlet excited state of a host and transferring energy from an electroplex to a guest molecule, in this manner.

As another process, there is thought to be an elementary process where one of first and second organic compounds serving as hosts forms a singlet exciton and then interacts with the other in the ground state to form an exciplex. Unlike an electroplex, a singlet exciton of the host is temporarily generated in this case, but this is rapidly converted into an exciplex, and thus, deactivation of the single exciton can be inhibited.

The experiment result below also shows that the singlet exciton of a host is converted into an exciplex rapidly. Thus, deactivation of the host can be inhibited. Accordingly, in accordance with one embodiment of the present invention, a light-emitting element having a long lifetime can be obtained.

Also in this case, the emission spectrum of the exciplex formed is located on the longer wavelength side than the emission wavelength of each of the first and second organic compounds.

The overlap between the emission spectrum of the exciplex and the absorption spectrum of the phosphorescent compound is larger than the overlap between the emission spectrum of the first organic compound (or the second organic compound) and the absorption spectrum of the phosphorescent compound. The light-emitting element in accordance with one embodiment of the present invention transfers energy by utilizing the overlap between the emission spectrum of the exciplex and the absorption spectrum of the phosphorescent compound and thus has high energy transfer efficiency. Therefore, in accordance with one embodiment of the present invention, a light-emitting element having high external quantum efficiency can be provided.

Note that in accordance with the above relation, the first organic compound is a compound having an electron-trapping property, while the second organic compound is a compound having a hole-trapping property. When the differences in HOMO level and LUMO level between the compounds are large (specifically, 0.3 eV or more), an electron preferentially enters the first organic compound and a hole preferentially enters the second organic compound. In this case, it is considered that the process where an electroplex is formed takes precedence over the process where an exciplex is formed through a singlet exciton.

In addition, there can be a concept that an exciplex has an energy level only in its excited state. Therefore, the molecules forming an exciplex are two or more independent molecules in ground states and the molecules do not form any complex in their ground states.

For example, when energy is transferred from an exciplex in an excited state to a guest molecule in a ground state and the guest molecule is put in an excited state, if the guest molecule tries to excite another molecule, the molecule to be excited is only the first organic compound or the second organic compound in one embodiment of the present invention. If the guest molecule in an excited state tries to excite the first organic compound or the second organic compound, the energy of the guest molecule in an excited state is not adequate, and thus the excitation cannot occur.

In other words, it is considered that a deactivation phenomenon of the guest molecule before light emission (that is, loss of emission efficiency) because energy of the excited state of the guest molecule is transferred to the exciplex reversely, does not occur in principle. This also contributes to improvement of emission efficiency.

As described above, in accordance with one embodiment of the present invention, the energy differences between the excited states and the ground states of molecules between which energy is transferred are preferably substantially equal. In other words, the excitation energy level of the exciplex and the excitation energy level of the guest are substantially equal. On the other hand, the excitation energy levels of the first organic compound and the second organic compound which form the exciplex are higher than the excitation energy level of the exciplex.

In other words, if the guest molecule in an excited state tries to excite the first organic compound or the second organic compound, the energy is not adequate and thus the probability of energy transfer from the guest molecule to another molecule is extremely low. Thus, the emission efficiency is increased in accordance with one embodiment of the present invention. In addition, thermal deactivation can be inhibited, so that the light-emitting element can have a longer lifetime, deteriorate less and have a higher reliability.

In addition, as described above, an exciplex is formed from a singlet exciton of the first organic compound or the second organic compound in some cases. In other words, a possible elementary process of formation of an exciplex is that one of the first and second organic compounds forms a singlet exciton and then interacts with the other in the ground state. This process seems to be done very rapidly.

A singlet exciton has a short excitation lifetime (small $\tau$). Thus, there is a problem in that part of excitation energy is lost (through light emission in a non-desired wavelength or thermal deactivation) before the excitation energy is transferred from a singlet exciton of a host to a guest material ($\Phi_{ET}$ tends to be small in Formula (3)).

However, in accordance with one embodiment of the present invention, such deactivation of excitation energy can be inhibited because the singlet exciton of a host rapidly forms an exciplex. Furthermore, the exciplex has a relatively long excitation lifetime, which is considered to increase the energy transfer efficiency $\Phi_{ET}$. Accordingly, it is possible to inhibit the deactivation of the singlet exciton of a host that may affect not only the efficiency of an element but also the lifetime thereof, so that a light-emitting element with a long lifetime can be achieved.

In addition, it is preferable that the excitation energy of the exciplex is sufficiently transferred to the phosphorescent compound, and that light emission from the exciplex is not substantially observed from the element. Therefore, energy is preferably transferred to the phosphorescent compound through the exciplex of the host so that the phosphorescent compound emits phosphorescence.

According to the above-described concept of energy transfer, it is effective when at least one of the first and second organic compounds is a fluorescent compound (i.e., a compound which is likely to undergo light emission or thermal deactivation from the singlet excited state). Therefore, at least one of the first and second organic compounds is preferably a fluorescent compound.

Note that in the case where a phosphorescent compound is used as an organic compound (first organic compound and/or second organic compound) serving as a host material, the organic compound itself is likely to emit light and unlikely to allow energy to be transferred to a guest material. In this case, it is favorable if the organic compound could emit light efficiently, but it is difficult to achieve high emission efficiency because the organic compound serving as a host causes the problem of concentration quenching. For this reason, it is preferable that the organic compound is a fluorescent compound and energy transfer is achieved with the above-described composition.

Note that the above-described effect can be obtained when an exciplex is formed from the first organic compound and the second organic compound. For example, no exciplex is formed by the method disclosed in Non-Patent Document 1, and thus a guest molecule can be excited through a direct recombination process, and the emission efficiency is not sufficiently high.

Note that in general, the use of an exciplex for a light-emitting layer of a light-emitting element has a value such as being capable of controlling the emission color, but usually causes a significant decrease in emission efficiency. Therefore, the use of an exciplex has been considered unsuitable for obtaining a highly efficient light-emitting element.

However, the present inventors have found that the use of an exciplex as a medium for energy transfer to a phosphorescent compound enables, on the contrary, emission efficiency to be maximized as shown in one embodiment of the present invention. This technical idea conflicts with the conventional fixed idea.

In addition, in accordance with one embodiment of the present invention, the excitation energy level of an exciplex and the energy level of a guest in an excited state are set to be substantially equal, and the transition probability of the guest to an excited state is increased, whereby the probability of energy transfer process is increased. As a result, sufficient energy transfer can be achieved even when the concentration of guests is from 0.1% to 2.5%, preferably from 0.1% to 1.5%, more preferably from 0.1% to 0.5%. With such concentrations, concentration quenching can be inhibited, and thereby the emission efficiency can be maximized.

BRIEF DESCRIPTION OF DRAWINGS

In the accompanying drawings:
FIG. 6 shows current vs. voltage plots of the light-emitting elements in Example 3;
FIG. 7 shows chromaticity vs. luminance plots of the light-emitting elements in Example 3;
FIG. 24 shows current efficiency vs. luminance plots of the light-emitting elements in Example 5;
FIG. 25 shows power efficiency vs. luminance plots of the light-emitting elements in Example 5.

BEST MODE FOR CARRYING OUT THE INVENTION

Figure 1A:
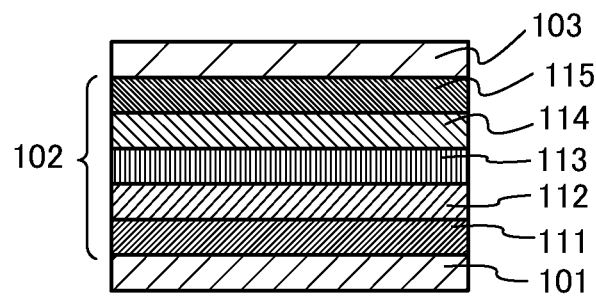
FIGS. 1A to 1C each illustrate a light-emitting element in accordance with one embodiment of the present invention.

Embodiments will now be described with reference to drawings in detail. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by Embodiment 1

In this embodiment, a light-emitting element in accordance with one embodiment of the present invention will be described. The light-emitting element of this embodiment includes a light-emitting layer including a guest as a light-emitting substance and a host in which the guest is dispersed. Specifically, a phosphorescent compound is used as the guest and a first organic compound and a second organic compound are used as hosts. In addition, the combination of the first organic compound and the second organic compound forms an exciplex.

In this embodiment, preferably, the level of a triplet excitation energy (T* level) of each of the organic compounds used as hosts is higher than that of the guest. This is because, when the T* level of the host is lower than that of the guest, the triplet excitation energy of the guest, which is to contribute to light emission, is quenched by the host and accordingly the emission efficiency is decreased.

As described above, when the T* level of the guest is substantially equal to the T* level of an exciplex, the T* level of the guest is lower than the T* level of the first organic compound (or the second organic compound). For that reason, the problem can often be overcome.

The first organic compound and the second organic compound serving as the hosts form an exciplex. When the exciplex formed emits light, the emission wavelength thereof is located on the longer wavelength side than the emission wavelength (fluorescent wavelength) of each of the first and second organic compounds. In other words, by formation of the exciplex, the fluorescent spectrum of the first organic compound and the fluorescent spectrum of the second organic compound can be converted into an emission spectrum which is located on the longer wavelength side.

Therefore, even when the fluorescent spectrum of the first organic compound (or the second organic compound) is located on the shorter wavelength side than the absorption band of the phosphorescent compound which is located on the longest wavelength side, and does not have an overlap with the absorption band, the fluorescent spectrum is converted into an emission spectrum with a long wavelength by forming an exciplex so as to have a large overlap with the absorption band.

The light-emitting element in this embodiment transfers energy from the exciplex to the phosphorescent compound with use of the overlap of an emission spectrum of the exciplex with an absorption spectrum of the phosphorescent compound, and thus sufficient energy transfer efficiency can be provided even when the concentration of guests is from 0.1% to 2.5%, preferably from 0.1% to 1.5%, more preferably from 0.1% to 0.5%.

To make the emission spectrum of the exciplex and the absorption spectrum of the guest material sufficiently overlap each other, the difference between the energy of a peak of the emission spectrum and the energy of a peak of the absorption band on the lowest energy side in the absorption spectrum is preferably 0.3 eV or less. The difference is more preferably 0.2 eV or less, even more preferably 0.1 eV or less.

The light emitting element in this embodiment will be described with reference to FIGS. 1A to 1C.

FIG. 1A illustrates a light-emitting element having an EL layer 102 between a first electrode 101 and a second electrode 103. The light-emitting element in FIG. 1A includes a hole-injection layer 111, a hole-transport layer 112, a light-emitting layer 113, an electron-transport layer 114, and an electron-injection layer 115 which are stacked over the first electrode 101 in this order and the second electrode 103 provided over the electron-injection layer 115.

For the first electrode 101, a metal, an alloy, an electrically conductive compound, a mixture thereof, or the like which has a high work function (specifically, a work function of 4.0 eV or more) is preferably used. Specific examples include indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide (IWZO), and the like.

Such conductive metal oxide films are usually formed by a sputtering method, but may also be formed by a sol-gel method or the like. For example, a film of indium oxide-zinc oxide can be formed by a sputtering method using a target in which zinc oxide is added to indium oxide at 1 wt % to 20 wt %. An IWZO film can be formed by a sputtering method using a target in which 0.5 wt % to 5 wt % of tungsten oxide and 0.1 wt % to 1 wt % of zinc oxide are added to indium oxide.

Other examples are graphene, gold, platinum, nickel, tungsten, chromium, molybdenum, iron, cobalt, copper, palladium, nitrides of metal materials (e.g., titanium nitride), and the like.

Note that, in the case where in the EL layer 102, a layer formed in contact with the first electrode 101 is formed using a composite material in which an organic compound and an electron acceptor (an acceptor) which are described later are mixed, the first electrode 101 can be formed using any of various types of metals, alloys, and electrically-conductive compounds, a mixture thereof, and the like regardless of the work function. For example, aluminum (Al), silver (Ag), an alloy containing aluminum (e.g., Al—Si), or the like can be used.

The first electrode 101 can be formed by, for example, a sputtering method, an evaporation method (including a vacuum evaporation method), or the like.

For the second electrode 103, any of metals, alloys, electrically conductive compounds, mixtures thereof, and the like which has a low work function (specifically, a work function of 3.8 eV or less) is preferably used. Specific examples thereof are elements that belong to Groups 1 and 2 in the periodic table, that is, alkali metals such as lithium and cesium, alkaline earth metals such as calcium and strontium, magnesium, alloys thereof (e.g., Mg—Ag and Al—Li), rare earth metals such as europium and ytterbium, alloys thereof, aluminum, silver, and the like.

When a layer included in the EL layer 102 and formed in contact with the second electrode 103 is formed using a later-described composite material including an organic compound and an electron donor (a donor), any of a variety of conductive materials, such as Al, Ag, ITO, and indium oxide-tin oxide containing silicon or silicon oxide, can be used regardless of the work function.

Note that the second electrode 103 can be formed by a vacuum evaporation method or a sputtering method. Alternatively, in the case of using a silver paste or the like, a coating method, an inkjet method, or the like can be used.

The EL layer 102 includes at least the light-emitting layer 113. For part of the EL layer 102, a known substance can be used, and either a low molecular compound or a high molecular compound can be used. Note that substances forming the EL layer 102 may consist of organic compounds or may include an inorganic compound as a part.

Further, as illustrated in FIG. 1A, the EL layer 102 is formed by stacking as appropriate the hole-injection layer 111 containing a substance having a high hole-injection property, the hole-transport layer 112 containing a substance having a high hole-transport property, the electron-transport layer 114 containing a substance having a high electron-transport property, the electron-injection layer 115 containing a substance having a high electron-injection property, and the like in addition to the light-emitting layer 113.

The hole-injection layer 111 is a layer containing a substance with a high hole-injection property. As the substance having a high hole-injection property, metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Alternatively, the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. For example, the following high molecular compound can be used: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl)methacrylamide] (abbreviation: PTPDMA); poly[N,N'-bis(4-butylphenyl)-N,N'-bis(phenyl)benzidine] (abbreviation: Poly-TPD); and the like. A high molecular compound to which acid is added, such as poly(3,4-ethylenedioxythiophene)/poly(styrenesulfonic acid) (PEDOT/PSS), or polyaniline/poly(styrenesulfonic acid) (PAni/PSS), can also be used.

A composite material in which an organic compound and an electron acceptor (an acceptor) are mixed may be used for the hole-injection layer 111. Such a composite material is superior in a hole-injection property and a hole-transport property, since holes are generated in the organic compound by an electron acceptor. In this case, the organic compound is preferably a material excellent in transporting generated holes (a substance having a high hole-transport property).

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. However, other substances than the above described materials may also be used as long as the substances have higher hole-transport properties than electron-transport properties. The organic compounds which can be used for the composite material will be specifically shown below.

Examples of the organic compound that can be used for the composite material are aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), 9-phenyl-3-[4-(10-phenyl-9-anthryl)phenyl]-9H-carbazole (abbreviation: PCzPA), and 1,4-bis[4-(N-carbazolyl)-phenyl]-2,3,5,6-tetraphenylbenzene.

In addition, it is possible to use the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Further alternatively, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

Further, as the electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

Note that the hole-injection layer 111 may be formed using a composite material of the above-described high molecular compound, such as PVK, PVTPA, PTPDMA, or Poly-TPD, and the above-described electron acceptor.

The hole-transport layer 112 is a layer that contains a substance with a high hole-transport property. Examples of the substance having a high hole-transport property are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/V·s or higher. However, other substances than the above described materials may also be used as long as the substances have higher hole-transport properties than electron-transport properties. The layer containing a substance with a high hole-transport property is not limited to a single layer, and two or more layers containing the aforementioned substances may be stacked.

For the hole-transport layer 112, a carbazole derivative such as CBP, CzPA, or PCzPA or an anthracene derivative such as t-BuDNA, DNA, or DPAnth may also be used.

Alternatively, for the hole-transport layer 112, a high molecular compound such as PVK, PVTPA, PTPDMA, or Poly-TPD can be used.

The light-emitting layer 113 is a layer including a light-emitting substance. The light-emitting layer 113 in this embodiment includes a phosphorescent compound as the guest and the first organic compound and the second organic compound as the hosts. Two or more kinds of hosts can be used. The ratio of the weight of the guest is from 0.1% to 2.5%, preferably from 0.1% to 1.5%, more preferably from 0.1% to 0.5% of the total weight of the hosts (the total weight of the first organic compound and the second organic compound when they are used as hosts).

As the phosphorescent compound, an organometallic complex is preferable, and in particular, an iridium complex is preferable. In consideration of energy transfer due to Förster mechanism described above, the molar absorption coefficient of the absorption band of the phosphorescent compound which is located on the longest wavelength side is preferably 2000 $M^{-1} \cdot cm^{-1}$ or more, more preferably 5000 $M^{-1} \cdot cm^{-1}$ or more.

Examples of compounds having such a high molar absorption coefficient are bis(3,5-dimethyl-2-phenylpyrazinato)(dipivaloylmethanato)iridium(III) (abbreviation: [Ir(mppr-Me)$_2$(dpm)]), (acetylacetonato)bis(4,6-diphenylpyrimidinato)iridium(III) (abbreviation: [Ir(dppm)$_2$(acac)]), (acetylacetonato)bis[4-(2-norbornyl)-6-phenylpyrimidinato]iridium(III) (abbreviation: [Ir(nbppm)$_2$(acac)]), (2,6-dimethyl-3,5-heptanedionato-$\kappa^2$O,O')bis[4-methyl-2-(3-methyl-4-pyrimidinyl-$\kappa$N3) phenyl-$\kappa$C]iridium(III) (abbreviation: [Ir(5mdppm)$_2$(dibm)]), (acetylacetonato)bis(2-phenyldibenzo[f,h]quinoxalinato)iridium(III) (abbreviation: Ir(dbq-P)$_2$(acac)), and the like. In particular, when a material having a molar absorption coefficient of 5000 $M^{-1} \cdot cm^{-1}$ or more, such as [Ir(dppm)$_2$(acac)], is used, a light-emitting element that can achieve an external quantum efficiency of about 30% can be obtained.

An example of the combination of a first organic compound and a second organic compound is preferably a combination of at least one of compounds which are likely to accept electrons, such as 2-[3-(dibenzothiophen-4-yl)phenyl]dibenzo[f,h]quinoxaline (abbreviation: 2mDBTPDB q-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II), and at least one of compounds which are likely to accept holes, such as 4,4'-bis[N-(1-naphthyl)-N-phenylamino]biphenyl (abbreviation: NPB or α-NPD), 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB). Note that the present invention is not limited to these compounds as long as the combination can form an exciplex.

Table 1 shows major physical properties of 2mDBTPDBq-II, PCBNBB, and [Ir(dppm)$_2$(acac)] and [Ir(mppr-Me)$_2$(dpm)] which are suitable phosphorescent compounds when 2mDBTPDBq-II and PCBNBB are used.

TABLE 1

| Substances | LUMO level | HOMO level | T* level |
|---|---|---|---|
| 2mDBTPDBq-II | −2.78 eV | −5.88 eV | 2.54 eV |
| PCBNBB | −2.31 eV | −5.46 eV | 2.40 eV |
| [Ir(dppm)$_2$(acac)] | −2.98 eV | −5.56 eV | 2.22 eV |
| [Ir(mppr-Me)$_2$(dpm)] | −2.77 eV | −5.50 eV | 2.26 eV |

In the light-emitting layer 113 where 2mDBTPDBq-II and PCBNBB are mixed, the LUMO level is −2.78 eV and the HOMO level is −5.46 eV. These levels are equal to the LUMO level and the HOMO level of the exciplex of 2mDBTPDBq-II and PCBNBB. In addition, the LUMO level and the HOMO level of [Ir(mppr-Me)$_2$(dpm)] which is the phosphorescent compound are substantially at the same levels.

On the other hand, both the LUMO level and the HOMO level of [Ir(dppm)$_2$(acac)] are lower than those above; thus, it is found that [Ir(dppm)$_2$(acac)] is likely to trap electrons. This indicates that the probability of the direct recombination process is higher in the case of using [Ir(dppm)$_2$(acac)] as the guest than in the case of using [Ir(mppr-Me)$_2$(dpm)].

In addition, the energy level (T* level) of each of [Ir(mppr-Me)$_2$(dpm)] and [Ir(dppm)$_2$(acac)] in the triplet excited state is lower than the energy level of each of 2mDBTPDBq-II and PCBNBB in the triplet excited state by 0.1 eV or more. Thus, there is a low probability that [Ir(mppr-Me)$_2$(dpm)] or [Ir(dppm)$_2$(acac)] in the triplet excited state transfers its state to the triplet excited state of 2mDBTPDBq-II or PCBNBB. In particular, the T* level of [Ir(dppm)$_2$(acac)] is lower by 0.18 eV or more, which indicates that [Ir(dppm)$_2$(acac)] has higher emission efficiency than [Ir(mppr-Me)$_2$(dpm)].

The electron-transport layer 114 is a layer containing a substance with a high electron transport property. As the substance having a high electron-transport property, the following metal complexes can be given: Alq$_3$; tris(4-methyl-8-quinolinolato)aluminum (abbreviation: Almq$_3$); bis(10-hydroxybenzo[h]-quinolinato)beryllium (abbreviation: BeBq$_2$); BAlq; Zn(BOX)$_2$; and bis[2-(2-hydroxyphenyl)benzothiazolato]zinc (abbreviation: Zn(BTZ)$_2$). Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances mentioned here are mainly ones that have an electron mobility of $10^{-6}$ cm$^2$/V·s or higher. Note that any substance other than the above substances may be used for the electron-transport layer as long as it is a substance in which the electron-transport property is higher than the hole-transport property.

Furthermore, the electron-transport layer is not limited to a single layer, and two or more layers made of the aforementioned substances may be stacked.

The electron-injection layer 115 is a layer including a substance having a high electron-injection property. For the electron-injection layer 115, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Alternatively, the above-mentioned substances for forming the electron-transport layer 114 can also be used.

Alternatively, a composite material in which an organic compound and an electron donor (a donor) are mixed may be used for the electron-injection layer 115. The composite material is superior in an electron-injection property and an electron-transport property, since electrons are generated in the organic compound by the electron donor.

In this case, the organic compound is preferably a material excellent in transporting generated electrons. Specifically, the above-described materials for forming the electron-transport layer 114 (e.g., a metal complex or a heteroaromatic compound) can be used for example.

As the electron donor, a substance exhibiting an electron-donating property to the organic compound may be used, and specifically, it is preferable to use an alkali metal, an alkaline-earth metal, or a rare earth metal, such as lithium, cesium, magnesium, calcium, erbium, or ytterbium. Further, an alkali metal oxide or an alkaline-earth metal oxide is preferable, and there are, for example, lithium oxide, calcium oxide, barium oxide, and the like. Alternatively, Lewis base such as magnesium oxide can also be used. Further alternatively, an organic compound such as tetrathiafulvalene (abbreviation: TTF) can be used.

Note that each of the above-described hole-injection layer 111, hole-transport layer 112, light-emitting layer 113, electron-transport layer 114, and electron-injection layer 115 can be formed by a method such as an evaporation method (e.g., a vacuum evaporation method), an inkjet method, or a coating method.

Figure 1B:
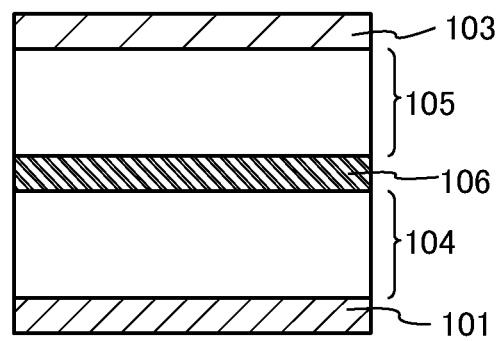

As illustrated in FIG. 1B, a plurality of EL layers may be stacked between the first electrode 101 and the second electrode 103. In that case, a charge generation layer 106 is preferably provided between a first EL layer 104 and a second EL layer 105 which are stacked. The charge generation layer 106 can be formed by using any of the above-mentioned composite materials.

Further, the charge generation layer 106 may have a stacked structure including a layer containing the composite material and a layer containing another material. In that case, as the layer containing another material, a layer containing an electron donating substance and a substance with a high electron-transport property, a layer formed of a transparent conductive film, or the like can be used.

As for a light-emitting element having such a structure, problems such as energy transfer and quenching hardly occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-mentioned structures of the EL layer.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. This can be applied to a light-emitting element having three or more EL layers.

Figure 1C:
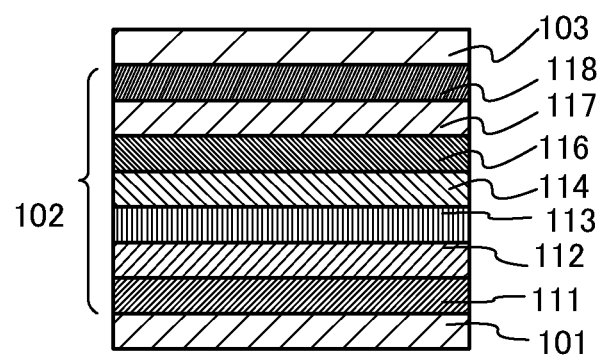

As illustrated in FIG. 1C, the EL layer 102 may include the hole-injection layer 111, the hole-transport layer 112, the light-emitting layer 113, the electron-transport layer 114, an electron-injection buffer layer 116, an electron-relay layer 117, and a composite material layer 118 which is in contact with the second electrode 103, between the first electrode 101 and the second electrode 103.

It is preferable to provide the composite material layer 118 which is in contact with the second electrode 103, in which case damage caused to the EL layer 102 particularly when the second electrode 103 is formed by a sputtering method can be reduced. The composite material layer 118 can be formed using the above composite material in which an acceptor substance is contained in an organic compound having a high hole-transport property.

Further, by providing the electron-injection buffer layer 116, an injection barrier between the composite material layer 118 and the electron-transport layer 114 can be reduced; thus, electrons generated in the composite material layer 118 can be easily injected to the electron-transport layer 114.

For the electron-injection buffer layer 116, a substance having a high electron-injection property, such as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate), can be used.

Further, in the case where the electron-injection buffer layer 116 includes a substance having a high electron-transport property and a donor substance, the donor substance is preferably added so that the mass ratio of the donor substance to the substance having a high electron-transport property is from 0.001:1 to 0.1:1.

Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate).

Note that as the substance having a high electron-transport property, a material similar to the material for the electron-transport layer 114 described above can be used.

Furthermore, the electron-relay layer 117 is preferably formed between the electron-injection buffer layer 116 and the composite material layer 118. The electron-relay layer 117 is not necessarily provided; however, by providing the electron-relay layer 117 having a high electron-transport property, electrons can be rapidly transported to the electron-injection buffer layer 116.

The structure in which the electron-relay layer 117 is sandwiched between the composite material layer 118 and the electron-injection buffer layer 116 is a structure in which the acceptor substance contained in the composite material layer 118 and the donor substance contained in the electron-injection buffer layer 116 are less likely to interact with each other, and thus their functions hardly interfere with each other. Accordingly, an increase in the driving voltage can be prevented.

The electron-relay layer 117 contains a substance having a high electron-transport property and is formed so that the LUMO level of the substance having a high electron-transport property is located between the LUMO level of the acceptor substance contained in the composite material layer 118 and the LUMO level of the substance having a high electron-transport property contained in the electron-transport layer 114.

In the case where the electron-relay layer 117 contains a donor substance, the donor level of the donor substance is controlled so as to be located between the LUMO level of the acceptor substance in the composite material layer 118 and the LUMO level of the substance having a high electron-transport property contained in the electron-transport layer 114. As a specific value of the energy level, the LUMO level of the substance having a high electron-transport property contained in the electron-relay layer 117 is preferably higher than or equal to −5.0 eV, more preferably higher than or equal to −5.0 eV and lower than or equal to −3.0 eV.

As the substance having an excellent electron-transport property included in the electron-relay layer 117, a phthalocyanine-based material or a metal complex having a metal-oxygen bond and an aromatic ligand is preferably used.

As the phthalocyanine-based material contained in the electron relay layer 117, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex which has a metal-oxygen bond and an aromatic ligand and is included in the electron-relay layer 117, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. For that reason, such a phthalocyanine derivative has an advantage of being easily handled during formation of the light-emitting element and an advantage of facilitating maintenance of an apparatus used for forming a film.

The electron-relay layer 117 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is included in the electron-relay layer 117, electrons can be transferred easily and the light-emitting element can be driven at a lower voltage.

In the case where a donor substance is included in the electron-relay layer 117, other than the materials described above as the substance having a high electron-transport property, a substance having a LUMO level higher than the acceptor level of the acceptor substance included in the composite material layer 118 can be used.

As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that the nitrogen-containing condensed aromatic compound is preferably used for the electron-relay layer 117 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene) (abbreviation: DCMT), methanofullerene (e.g., [6,6]-phenyl C$_{61}$ butyric acid methyl ester), or the like can be used.

Note that in the case where a donor substance is included in the electron-relay layer 117, the electron-relay layer 117 may be formed by a method such as co-evaporation of the substance having a high electron-transport property and the donor substance.

The hole-injection layer 111, the hole-transport layer 112, the light-emitting layer 113, and the electron-transport layer 114 may each be formed using any of the above-described materials.

In the above manner, the EL layer 102 of this embodiment can be formed.

In the above-described light-emitting element, current flows due to a potential difference generated between the first electrode 101 and the second electrode 103 and holes and electrons recombine in the EL layer 102, whereby light is emitted. Then, the emitted light is extracted outside through one or both of the first electrode 101 and the second electrode 103. Therefore, one or both of the first electrode 101 and the second electrode 103 is/are electrode(s) having a property of transmitting visible light.

Further, a structure of a layer provided between the first electrode 101 and the second electrode 103 is not limited to the above described structure. Any structure other than the above may alternatively be employed as long as a light-emitting region in which holes and electrons recombine is provided in a portion away from the first electrode 101 and the second electrode 103 in order to prevent quenching due to proximity of the light-emitting region to a metal.

In other words, a stacked structure of the layer is not particularly limited, and a layer formed of a substance having a high electron-transport property, a substance having a high hole-transport property, a substance having a high electron-injection property, a substance having a high hole-injection property, a bipolar substance (a substance having a high electron-transport property and a high hole-transport property), a hole-blocking material, or the like may freely be combined with a light-emitting layer.

With the use of the light-emitting element described in this embodiment, a passive matrix light-emitting device or an active matrix light-emitting device in which a transistor controls driving of the light-emitting element can be formed. Furthermore, the light-emitting device can be applied to electronic devices, lighting devices, or the like.

In the above-described manner, the light-emitting element in accordance with one embodiment of the present invention can be fabricated. This embodiment can be combined with any of the other embodiments as appropriate.

Example 1

In this example, an example of a combination of a first organic compound, a second organic compound, and a phosphorescent compound which can be used for a light-emitting element in accordance with one embodiment of the present invention will be described with reference to FIGS. 2A and 2B.

The phosphorescent compound used in this example was bis(3,5-dimethyl-2-phenylpyrazinato)(dipivaloylmethanato)iridium(III) (abbreviation: [Ir(mppr-Me)$_2$(dpm)]). The first organic compound used in this example was 2-[3-(dibenzothiophen-4-yl)phenyl]dibenzo[f,h]quinoxaline (abbreviation: 2mDBTPDBq-II). The second organic compound used in this example was 4,4'-di(1-naphthyl)-4"-(9-phenyl-9H-carbazol-3-yl)triphenylamine (abbreviation: PCBNBB). Chemical formulae of the materials described above are shown below.

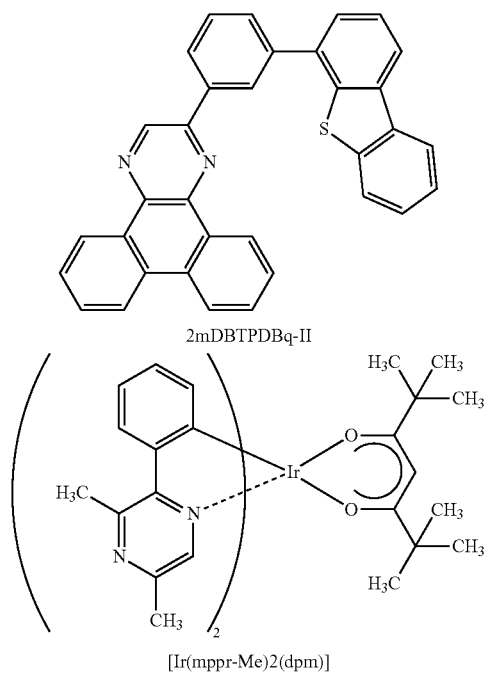

2mDBTPDBq-II

[Ir(mppr-Me)2(dpm)]

-continued

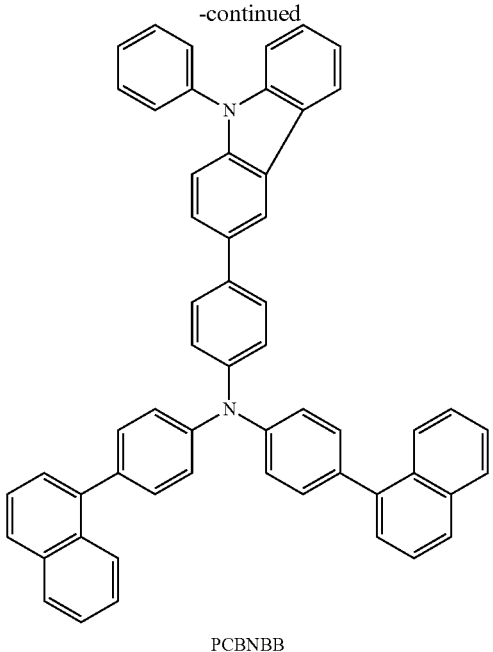

PCBNBB

<Absorption Spectrum>

Figure 2A:
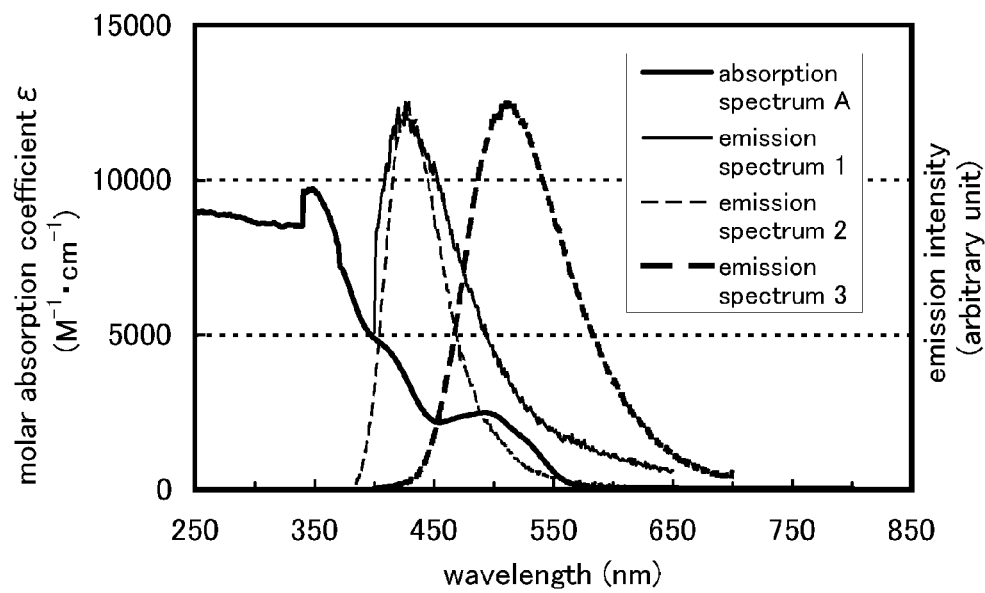
FIGS. 2A and 2B each show an absorption spectrum and emission spectra in Example 1.
Figure 2B:
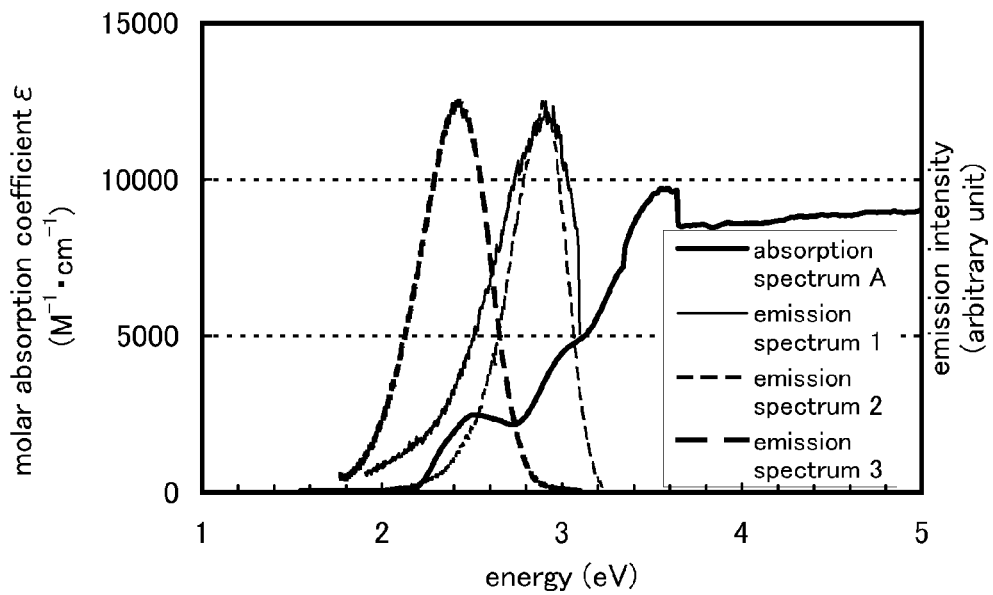

FIGS. 2A and 2B each show an ultraviolet-visible absorption spectrum (absorption spectrum A) of [Ir(mppr-Me)$_2$(dpm)] that was the phosphorescent compound, in a dichloromethane solution. The absorption spectrum was measured with the use of an ultraviolet-visible light spectrophotometer (V-550, manufactured by JASCO Corporation) in the state where the dichloromethane solution (0.093 mmol/L) was put in a quartz cell at room temperature.

<Emission Spectrum>

FIGS. 2A and 2B each also show an emission spectrum of a thin film of 2mDBTPDBq-II that was the first organic compound (an emission spectrum 1), an emission spectrum of a thin film of PCBNBB that was the second organic compound (an emission spectrum 2), and an emission spectrum of a thin film of a mixed material of 2mDBTPDBq-II and PCBNBB (an emission spectrum 3). In FIG. 2A, the horizontal axis represents wavelength (nm), and the vertical axes represent molar absorption coefficient ε ($M^{-1} \cdot cm^{-1}$) and emission intensity (arbitrary unit). In FIG. 2B, the horizontal axis represents energy (eV), and the vertical axes represent molar absorption coefficient ε ($M^{-1} \cdot cm^{-1}$) and emission intensity (arbitrary unit).

As can be seen from the absorption spectrum A in FIG. 2A, [Ir(mppr-Me)$_2$(dpm)] has a broad absorption band at around 500 nm. This absorption band is considered to greatly contribute to light emission.

The emission spectrum 3 peaks at a longer wavelength (lower energy) than the emission spectra 1 and 2. In addition, the peak of the emission spectrum 3 is closer to the absorption band than the peaks of the emission spectra 1 and 2. FIGS. 2A and 2B show that the emission spectrum 3 has the largest overlap with the absorption band in the absorption spectrum A which greatly contributes to light emission. Specifically, the difference in peak between the absorption spectrum A and the emission spectrum 3 is 0.10 eV.

It is found that the emission spectrum of the mixed material of 2mDBTPDBq-II and PCBNBB peaks at a longer wavelength (lower energy) than the emission spectrum of either organic compound alone. This indicates that an exciplex is formed from a mixture of 2mDBTPDBq-II with PCBNBB.

It is found that the emission spectrum of the mixed material has a large overlap with the absorption band in the absorption spectrum of [Ir(mppr-Me)$_2$(dpm)] which is considered to greatly contribute to light emission. Thus, it is indicated that the light-emitting element including [Ir(mppr-Me)$_2$(dpm)] as a guest and the mixed material of 2mDBTPDBq-II and PCB-NBB as a host has high energy transfer efficiency because they transfer energy by utilizing the overlap between the emission spectrum of the mixed material and the absorption spectrum of the phosphorescent compound. Accordingly, a light-emitting element with high external quantum efficiency can be provided.

Example 2

In this example, an example of a combination of a first organic compound, a second organic compound, and a phosphorescent compound which can be used for a light-emitting element in accordance with one embodiment of the present invention will be described with reference to FIGS. 3A and 3B.

The phosphorescent compound used in this example was (acetylacetonato)bis(4,6-diphenylpyrimidinato)iridium(III) (abbreviation: [Ir(dppm)$_2$(acac)]). The first organic compound used in this example was 2mDBTPDBq-II. The second organic compound used in this example was PCBNBB. Chemical formulae of materials used in this example are shown below. Note that the chemical formulae of the materials used in Example 1 are not shown here.

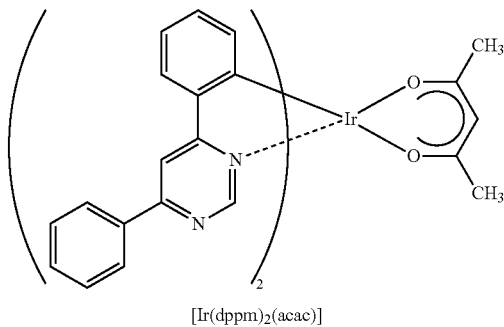

[Ir(dppm)$_2$(acac)]

Figure 3A:
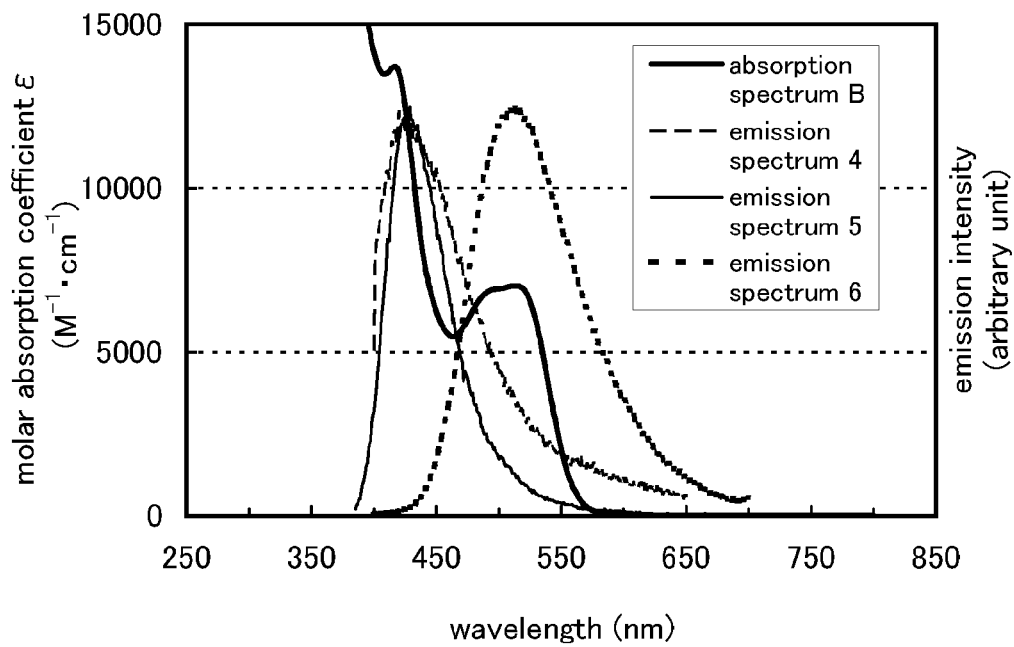
FIGS. 3A and 3B each show an absorption spectrum and emission spectra in Example 2.
Figure 3B:
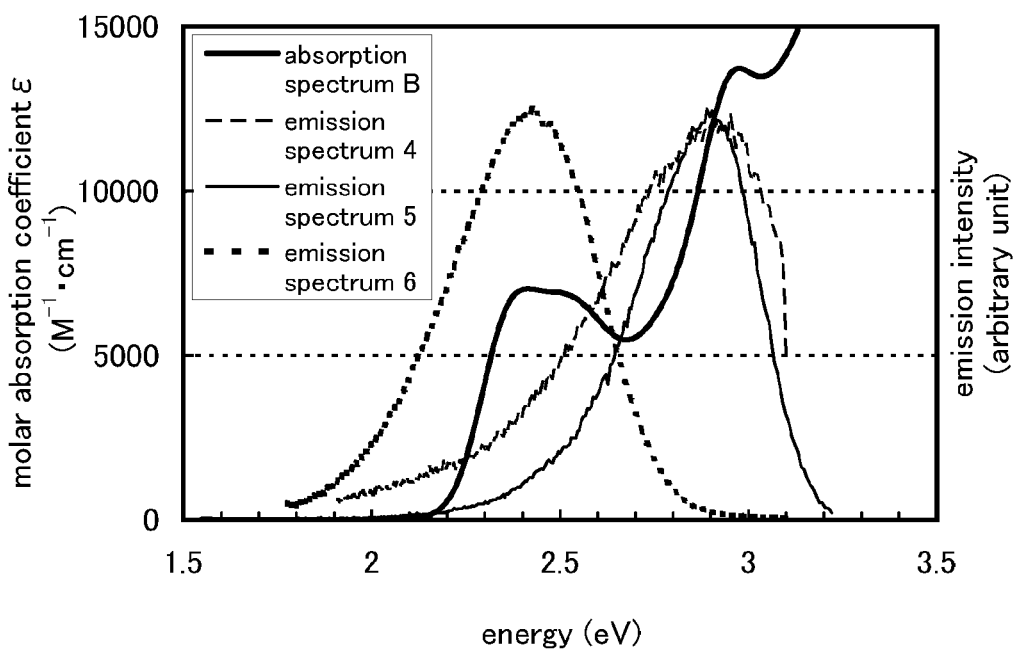

<Absorption Spectrum>
FIGS. 3A and 3B each show an ultraviolet-visible absorption spectrum (absorption spectrum B) of [Ir(dppm)$_2$(acac)] that was the phosphorescent compound, in a dichloromethane solution. The absorption spectrum was measured with the use of an ultraviolet-visible light spectrophotometer (V-550, manufactured by JASCO Corporation) in the state where the dichloromethane solution (0.093 mmol/L) was put in a quartz cell at room temperature.
<Emission Spectrum>
FIGS. 3A and 3B each also show an emission spectrum of a thin film of 2mDBTPDBq-II that was the first organic compound (an emission spectrum 4), an emission spectrum of a thin film of PCBNBB that was the second organic compound (an emission spectrum 5), and an emission spectrum of a thin film of a mixed material of 2mDBTPDBq-II and PCB-NBB (an emission spectrum 6). In FIG. 3A, the horizontal axis represents wavelength (nm), and the vertical axes represent molar absorption coefficient $\epsilon 0$ (M$^{-1}$·cm$^{-1}$) and emission intensity (arbitrary unit). In FIG. 3B, the horizontal axis represents energy (eV), and the vertical axes represent molar absorption coefficient $\epsilon$ (M$^{-1}$·cm$^{-1}$) and emission intensity (arbitrary unit).

As can be seen from the absorption spectrum B in FIG. 3A, [Ir(dppm)$_2$(acac)] has a broad absorption band at around 520 nm. This absorption band is considered to greatly contribute to light emission.

The emission spectrum 6 peaks at a longer wavelength (lower energy) than the emission spectra 4 and 5. In addition, the peak of the emission spectrum 6 is closer to the absorption band than the peaks of the emission spectra 4 and 5. FIGS. 3A and 3B show that the emission spectrum 6 has the largest overlap with the absorption band in the absorption spectrum B which greatly contributes to light emission. Specifically, the difference in peak between the absorption spectrum B and the emission spectrum 6 is 0.02 eV.

It is found that the emission spectrum of the mixed material of 2mDBTPDBq-II and PCBNBB peaks at a longer wavelength (lower energy) than the emission spectrum of either organic compound alone. This indicates that an exciplex is formed from a mixture of 2mDBTPDBq-II with PCBNBB.

It is found that the peak of the emission spectrum of the mixed material has a large overlap with the absorption band in the absorption spectrum of [Ir(dppm)$_2$(acac)] which is considered to greatly contribute to light emission. In addition, the molar absorption coefficient is 5000 M$^{-1}$·cm$^{-1}$. Thus, it is indicated that the light-emitting element including [Ir(dppm)$_2$(acac)] as a guest and including the mixed material of 2mDBTPDBq-II and PCBNBB as a host has high energy transfer efficiency because it transfers energy by utilizing the overlap between the emission spectrum of the mixed material and the absorption spectrum of the phosphorescent compound. Further, sufficient energy transfer can be expected even when the concentration of the guest is low.

Example 3

In this example, in light-emitting elements, an organometallic complex serving as a phosphorescent compound, (acetylacetonato)bis[4-(2-norbornyl)-6-phenylpyrimidinato]iridium(III) (abbreviation: [Ir(nbppm)$_2$(acac)]) was used as a guest, and the concentration of guests was changed. In this manner, the characteristics of the light-emitting elements were measured. A structure of [Ir(nbppm)$_2$(acac)] is shown below.

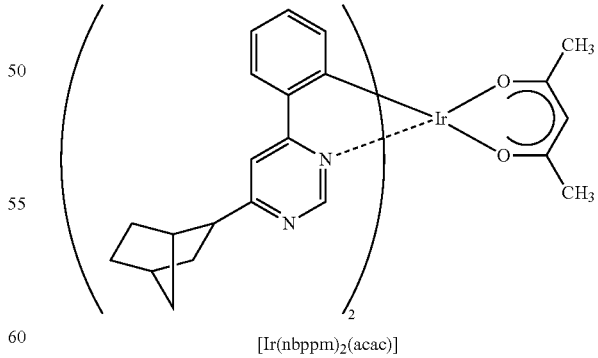

[Ir(nbppm)$_2$(acac)]

The first organic compound used in this example was 2mDBTPDBq-II. The second organic compound used in this example was 4-phenyl-4'-(9-phenyl-9H-carbazol-3-yl)triphenylamine (abbreviation: PCBA1BP). Note that the combination of 2mDBTPDBq-II and PCBA1BP forms an exciplex, similarly to the combination of 2mDBTPDBq-II and PCB-NBB in Example 1, and the emission spectrum is located in substantially the same portion as that in Example 1.

In this example, a light-emitting element 1, a light-emitting element 2, and a light-emitting element 3 with different concentrations of guests were fabricated, and the characteristics thereof were compared. The structure of the light-emitting element 1, the light-emitting element 2, and the light-emitting element 3 is illustrated in FIG. 1A. Structural formulae of organic compounds used in this example, which exclude the compounds described above, are shown below.

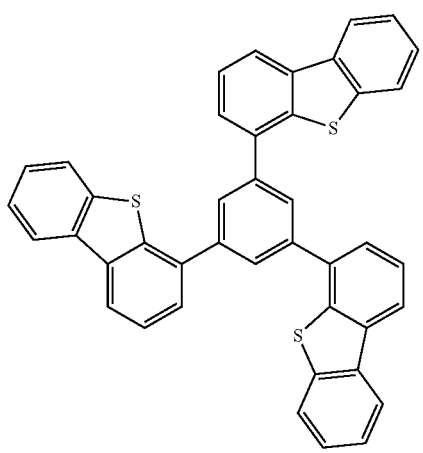

DBT3P-II

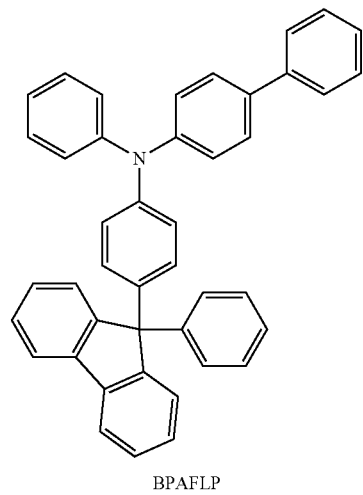

BPAFLP

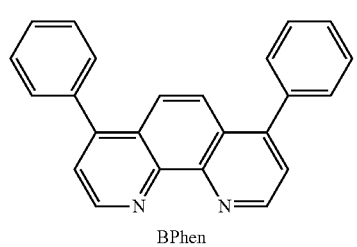

BPhen

-continued

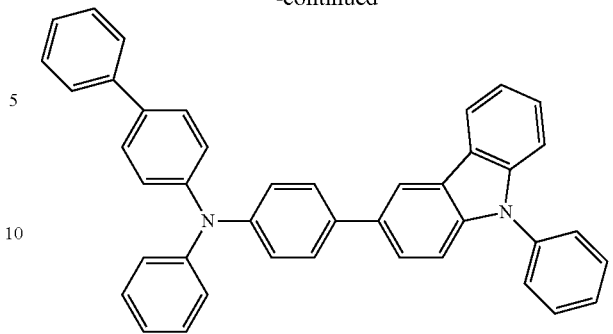

PCBA1BP

First, a glass substrate over which indium tin oxide including silicon (ITSO) with a thickness of 110 nm was formed as the first electrode 101 serving as an anode was prepared. A surface of the ITSO was covered with a polyimide film so that an area of 2 mm×2 mm of the surface was exposed. The electrode area was 2 mm×2 mm. As a pretreatment for forming the light-emitting element over the substrate, the surface of the substrate was washed with water and baked at 200° C. for one hour, and then a UV ozone treatment was performed for 370 seconds.

After that, the substrate was transferred into a vacuum evaporation apparatus whose pressure was reduced to about $10^{-4}$ Pa, vacuum baking at 170° C. for 30 minutes was performed in a heating chamber of the vacuum evaporation apparatus, and then the substrate was cooled down for about 30 minutes. Then, the substrate was fixed to a holder provided in an evaporation chamber in the vacuum evaporation apparatus so that the surface provided with ITSO faced downward.

The pressure in the evaporation chamber was reduced to about $10^{-4}$ Pa. Then, 1,3,5-tri(dibenzothiophen-4-yl)benzene (abbreviation: DBT3P-II) and molybdenum(VI) oxide were co-evaporated to form the hole-injection layer 111 such that the weight ratio of DBT3P-II to molybdenum oxide was 4:2. The thickness of the hole-injection layer 111 was set to 40 nm. Note that a co-evaporation method is an evaporation method in which a plurality of different substances is concurrently vaporized from respective different evaporation sources.

Next, 4-phenyl-4'-(9-phenylfluoren-9-yl)triphenylamine (abbreviation: BPAFLP) was deposited to a thickness of 20 nm by evaporation to form the hole-transport layer 112.

Over the hole-transport layer 112, 2mDBTPDBq-II, PCBA1BP, and [Ir(nbppm)$_2$(acac)] were co-evaporated so that the weight ratio of 2mDBTPDBq-II to PCBA1BP and [Ir(nbppm)$_2$(acac)] was 0.8:0.2:x to form the light-emitting layer 113 with a thickness of 40 nm. At this time, x was 0.01 in the case of the light-emitting element 1, x was 0.025 in the case of the light-emitting element 2, and x was 0.05 in the case of the light-emitting element 3.

Next, 2mDBTPDBq-II was deposited to a thickness of 10 nm by evaporation and then bathophenanthroline (abbreviation: BPhen) was deposited to a thickness of 20 nm by evaporation, so that the electron-transport layer 114 was formed. In other words, in this example, the electron-transport layer 114 includes the first electron-transport layer of 2mDBTPDBq-II with a thickness of 10 nm and the second electron-transport layer of BPhen with a thickness of 20 nm.

Further, lithium fluoride was deposited to a thickness of 1 nm over the electron-transport layer 114 by evaporation, so that the electron-injection layer 115 was formed. In this manner, the EL layer 102 was formed. Note that in the above evaporation process, evaporation was all performed by a resistance heating method.

Finally, aluminum was deposited to be 200 nm thick as the second electrode 103 serving as a cathode, whereby a light-emitting element was fabricated. Table 2 shows a stacked structure of the light-emitting element. In table 2, x was 0.01 in the case of the light-emitting element 1, x was 0.025 in the case of the light-emitting element 2, and x was 0.05 in the case of the light-emitting element 3.

TABLE 2

| | Light-emitting elements 1 to 3 |
|---|---|
| First electrode | ITSO, 110 nm |
| Hole-injection layer | DBT3P-II:MoOx (=4:2), 40 nm |
| Hole-transport layer | BPAFLP, 20 nm |
| Light-emitting layer | 2mDBTPDBq-II:PCBA1BP:[Ir(nbppm)$_2$(acac)] (=0.8:0.2:x), 40 nm |
| Electron-transport layer | 2mDBTPDBq-II, 10 nm |
| | BPhen, 20 nm |
| Electron-injection layer | LiF, 1 nm |
| Second electrode | Al, 200 nm |

The thusly fabricated light-emitting elements (the light-emitting elements 1 to 3) were sealed in a glove box under a nitrogen atmosphere (sealing by heat treatment at 80° C. for one hour) without being exposed to atmospheric air. Then, the operating characteristics of the light-emitting elements were measured. Note that the measurement was carried out at room temperature (in an atmosphere kept at 25° C.).

Figure 4:
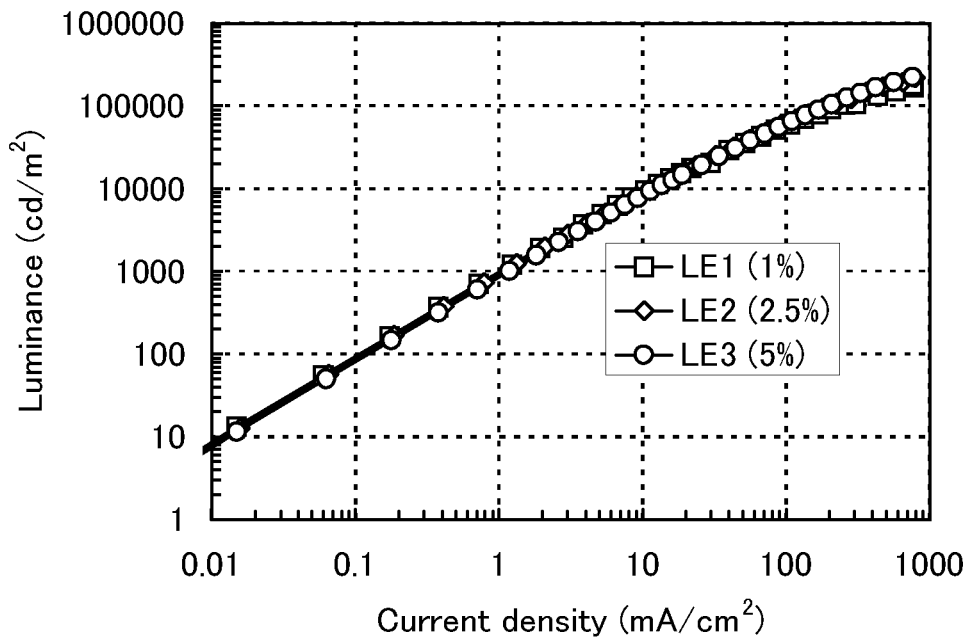
FIG. 4 shows luminance vs. current density plots of light-emitting elements in Example 3.
Figure 5:
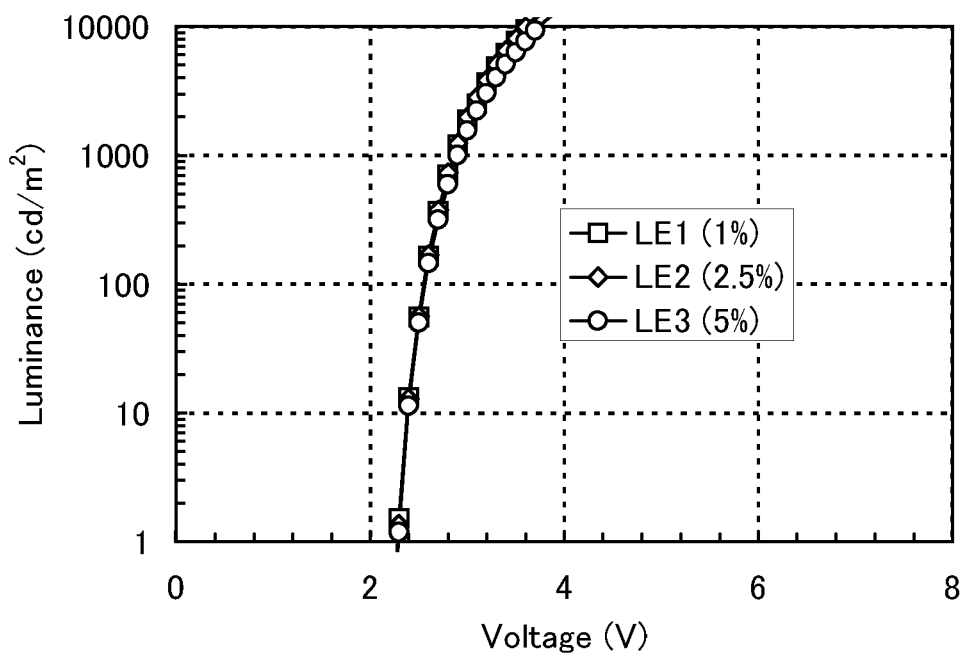
FIG. 5 shows luminance vs. voltage plots of the light-emitting elements in Example 3.

FIG. 4 shows luminance vs. current density plots of the light-emitting elements 1 to 3. In FIG. 4, the vertical axis represents luminance (cd/m$^2$), and the horizontal axis represents current density (mA/cm$^2$). FIG. 5 shows luminance vs. voltage plots of the light-emitting elements 1 to 3. In FIG. 5, the vertical axis represents luminance (cd/m$^2$), and the horizontal axis represents voltage (V). FIG. 6 shows current vs. voltage plots of the light-emitting elements 1 to 3. In FIG. 6, the vertical axis represents current (mA), and the horizontal axis represents voltage (V). FIG. 7 shows chromaticity vs. luminance plots of the light-emitting elements 1 to 3. In FIG. 7, the vertical axis represents chromaticity, and the horizontal axis represents luminance (cd/m$^2$).

Figure 8:
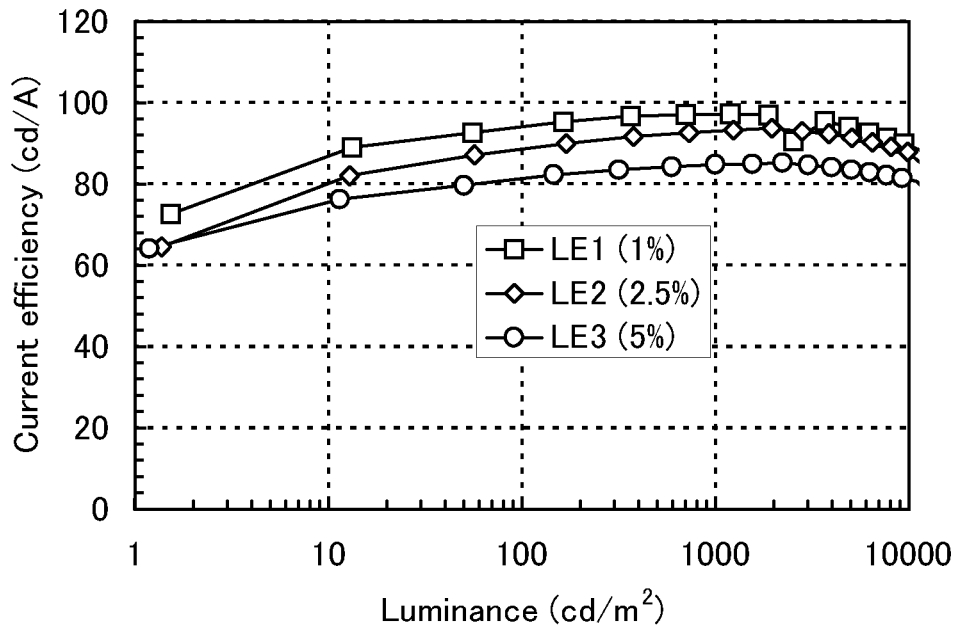
FIG. 8 shows current efficiency vs. luminance plots of the light-emitting elements in Example 3.
Figure 9:
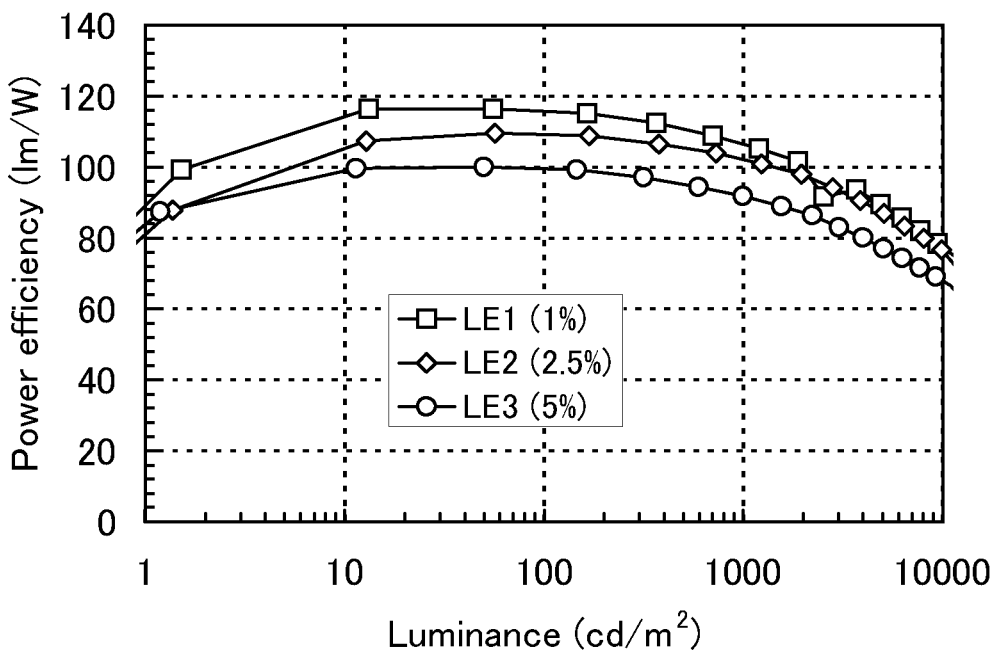
FIG. 9 shows power efficiency vs. luminance plots of the light-emitting elements in Example 3.
Figure 10:
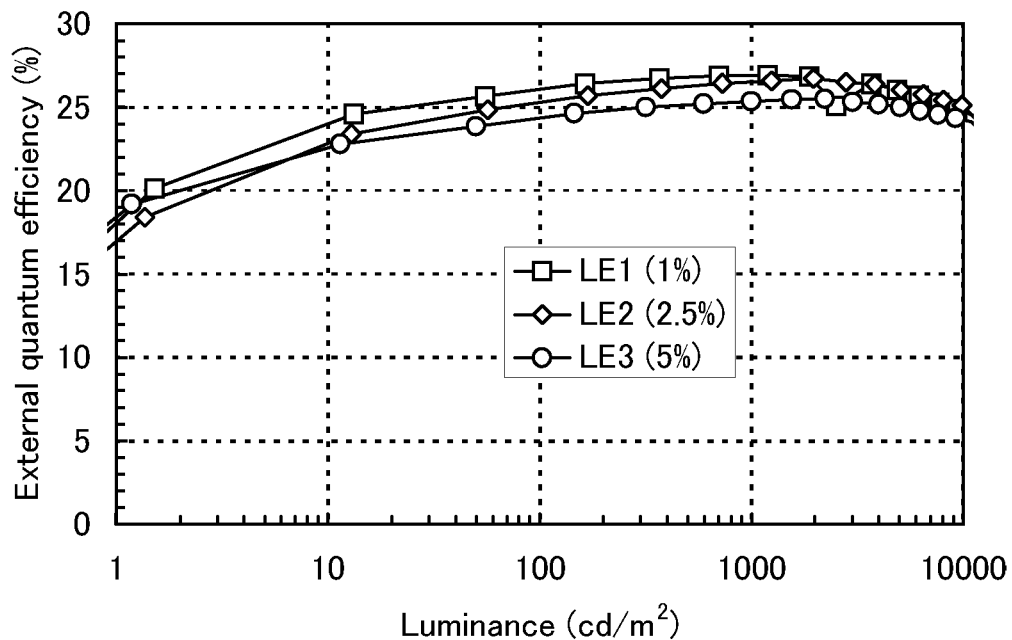
FIG. 10 shows quantum efficiency vs. luminance plots of the light-emitting elements in Example 3.
Figure 11:
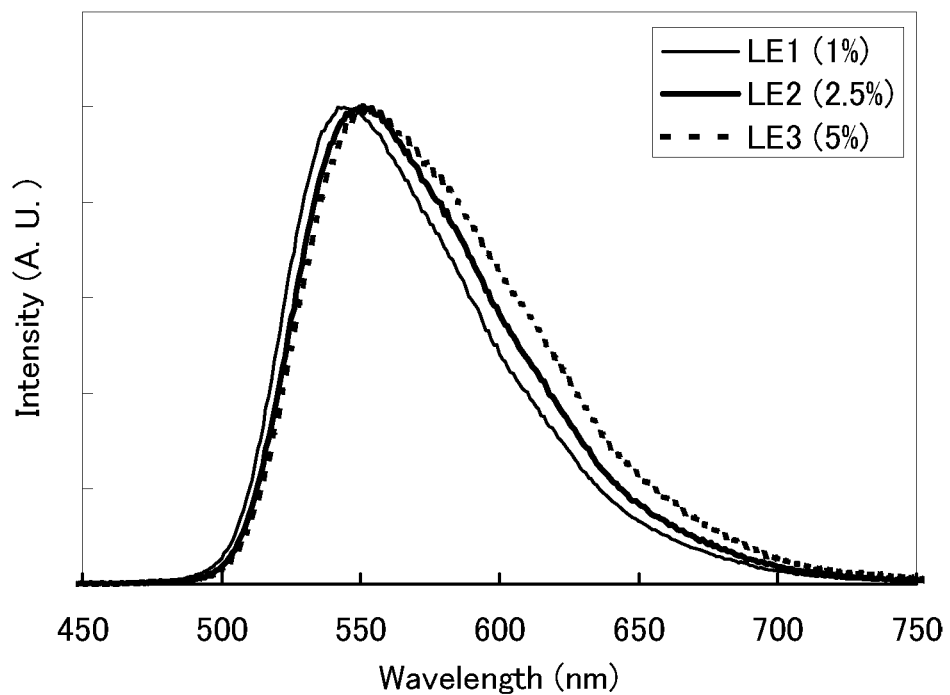
FIG. 11 shows emission spectra of the light-emitting elements in Example 3.

FIG. 8 shows current efficiency vs. luminance plots of the light-emitting elements 1 to 3. In FIG. 8, the vertical axis represents current efficiency (cd/A), and the horizontal axis represents luminance (cd/m$^2$). FIG. 9 shows power efficiency vs. luminance plots of the light-emitting elements 1 to 3. In FIG. 9, the vertical axis represents power efficiency (lm/W), and the horizontal axis represents luminance (cd/m$^2$). FIG. 10 shows quantum efficiency vs. luminance plots of the light-emitting elements 1 to 3. In FIG. 10, the vertical axis represents external quantum efficiency (%), and the horizontal axis represents luminance (cd/m$^2$). FIG. 11 shows emission spectra of the light-emitting elements 1 to 3. In FIG. 11, the vertical axis represents emission intensity (arbitrary unit), and the horizontal axis represents wavelength (nm).

In FIG. 4 to FIG. 11, LE1, LE2, and LE3 represent the light-emitting element 1, the light-emitting element 2, and the light-emitting element 3, respectively.

According to FIG. 4 to FIG. 11, it is found that the light-emitting element 1 with a lower concentration of guests exhibits higher emission efficiency than the light-emitting element 2 and the light-emitting element 3. Table 3 shows main characteristics of the light-emitting element 1 to the light-emitting element 3. In Table 3, LE1, LE2, and LE3 represent the light-emitting element 1, the light-emitting element 2, and the light-emitting element 3, respectively. Table 3 reveals that the light-emitting element 1 in which the ratio of the weight of the guest to the total weight of the hosts is 1% can exhibit characteristics superior to those of the light-emitting element 2 and the light-emitting element 3 in which the ratio is higher than in the light-emitting element 1.

TABLE 3

| | LE1 (1%) | LE2 (2.5%) | LE3 (5%) |
|---|---|---|---|
| Voltage (V) | 2.9 | 2.9 | 2.9 |
| Current density (mA/cm$^2$) | 1.23 | 1.33 | 1.18 |
| Chromaticity x | 0.4277 | 0.4463 | 0.4613 |
| Chromaticity y | 0.5615 | 0.5451 | 0.5301 |
| Luminance (cd/m$^2$) | 1195.0 | 1243.0 | 1001.0 |
| Current efficinecy (cd/A) | 97.17 | 93.12 | 84.70 |
| Power efficiency (lm/W) | 105.27 | 100.87 | 91.75 |
| External quantum efficiency (%) | 26.90 | 26.57 | 25.36 |

Example 4

In this example, in light-emitting elements, an organometallic complex serving as a phosphorescent compound, (2,6-dimethyl-3,5-heptanedionato-κ$^2$O,O')bis[4-methyl-2-(3-methyl-4-pyrimidinyl-κN3) phenyl-κC]iridium(III)) (abbreviation: [Ir(5mdppm)$_2$(dibm)]) was used as a guest, and the concentration of guests was chagned. In this manner, the characteristics of the light-emitting elements were measured. A structure of [Ir(5mdppm)$_2$(dibm)] is shown below.

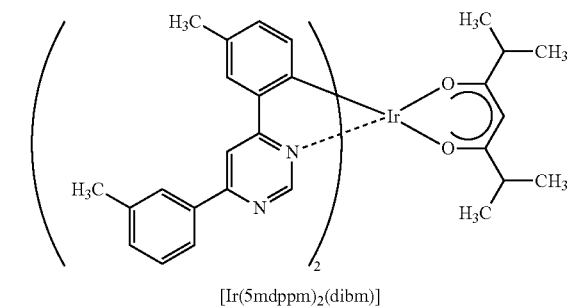

[Ir(5mdppm)$_2$(dibm)]

The first organic compound used in this example was 2mDBTPDBq-II. The second organic compound used in this example was 4,4'-bis[N-(1-naphthyl)-N-phenylamino]biphenyl (abbreviation: NPB). A structural formula of NPB is shown below. Note that the combination of 2mDBTPDBq-II and NPB forms an exciplex, similarly to the combination in Example 1, and the emission spectrum is located in substantially the same portion as that in Example 1.

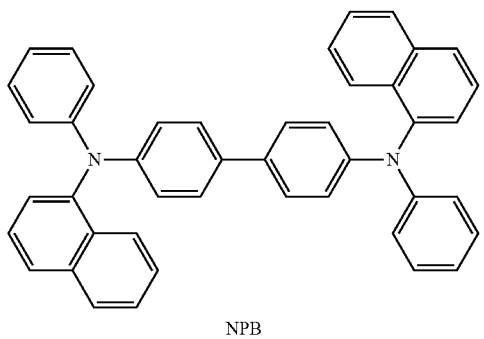

NPB

In this example, a light-emitting element 4, a light-emitting element 5, and a light-emitting element 6 with different concentrations of guests were fabricated, and the characteristics thereof were compared. The structure of the light-emitting element 4, the light-emitting element 5, and the light-emitting element 6 is illustrated in FIG. 1A.

First, a glass substrate over which indium tin oxide including silicon (ITSO) with a thickness of 110 nm was formed as the first electrode 101 serving as an anode was prepared. A surface of the ITSO was covered with a polyimide film so that an area of 2 mm×2 mm of the surface was exposed. The electrode area was 2 mm×2 mm. As a pretreatment for forming the light-emitting element over the substrate, the surface of the substrate was washed with water and baked at 200° C. for one hour, and then a UV ozone treatment was performed for 370 seconds.

After that, the substrate was transferred into a vacuum evaporation apparatus whose pressure was reduced to about $10^{-4}$ Pa, vacuum baking at 170° C. for 30 minutes was performed in a heating chamber of the vacuum evaporation apparatus, and then the substrate was cooled down for about 30 minutes. Then, the substrate was fixed to a holder provided in an evaporation chamber in the vacuum evaporation apparatus so that the surface provided with ITSO faced downward.

The pressure in the evaporation chamber was reduced to about $10^{-4}$ Pa. Then, DBT3P-II and molybdenum(VI) oxide were co-evaporated to form the hole-injection layer 111 such that the weight ratio of DBT3P-II to molybdenum oxide was 4:2. The thickness of the hole-injection layer 111 was set to 40 nm.

Next, BPAFLP was deposited to a thickness of 20 nm by evaporation to form the hole-transport layer 112.

Over the hole-transport layer 112, 2mDBTPDBq-II, NPB, and [Ir(5mdppm)$_2$(dibm)] were co-evaporated so that the weight ratio of 2mDBTPDBq-II to NBP NPB and Ir(5mdppm)$_2$(dibm) was 0.8:0.2:x to form the light-emitting layer 113 with a thickness of 40 nm. At this time, x was 0.01 in the case of the light-emitting element 4, x was 0.025 in the case of the light-emitting element 5, and x was 0.05 in the case of the light-emitting element 6.

Next, 2mDBTPDBq-II was deposited to a thickness of 10 nm by evaporation and then BPhen was deposited to a thickness of 20 nm by evaporation, so that the electron-transport layer 114 was formed. Further, lithium fluoride was deposited to a thickness of 1 nm over the electron-transport layer 114 by evaporation, so that the electron-injection layer 115 was formed. In this manner, the EL layer 102 was formed. Note that in the above evaporation process, evaporation was all performed by a resistance heating method.

Finally, aluminum was formed to be 200 nm thick as the second electrode 103 serving as a cathode, whereby a light-emitting element was fabricated. Table 4 shows a stacked structure of the light-emitting element. In Table 4, x was 0.01 in the case of the light-emitting element 4, x was 0.025 in the case of the light-emitting element 5, and x was 0.05 in the case of the light-emitting element 6.

TABLE 4

| | Light-emitting elements 4 to 6 |
|---|---|
| First electrode | ITSO, 110 nm |
| Hole-injection layer | DBT3P-II:MoOx (=4:2), 40 nm |
| Hole-transport layer | BPAFLP, 20 nm |
| Light-emitting layer | 2mDBTPDBq-II:NPB:[Ir(5mdppm)$_2$(dibm)] (=0.8:0.2:x), 40 nm |
| Electron-transport layer | 2mDBTPDBq-II, 10 nm |
| | BPhen, 20 nm |
| Electron-injection layer | LiF, 1 nm |
| Second electrode | Al, 200 nm |

The thusly fabricated light-emitting elements (the light-emitting elements 4 to 6) were sealed in a glove box under a nitrogen atmosphere (sealing by heat treatment at 80° C. for one hour) without being exposed to atmospheric air. Then, the operating characteristics of the light-emitting elements were measured. Note that the measurement was carried out at room temperature (in an atmosphere kept at 25° C.).

Figure 12:
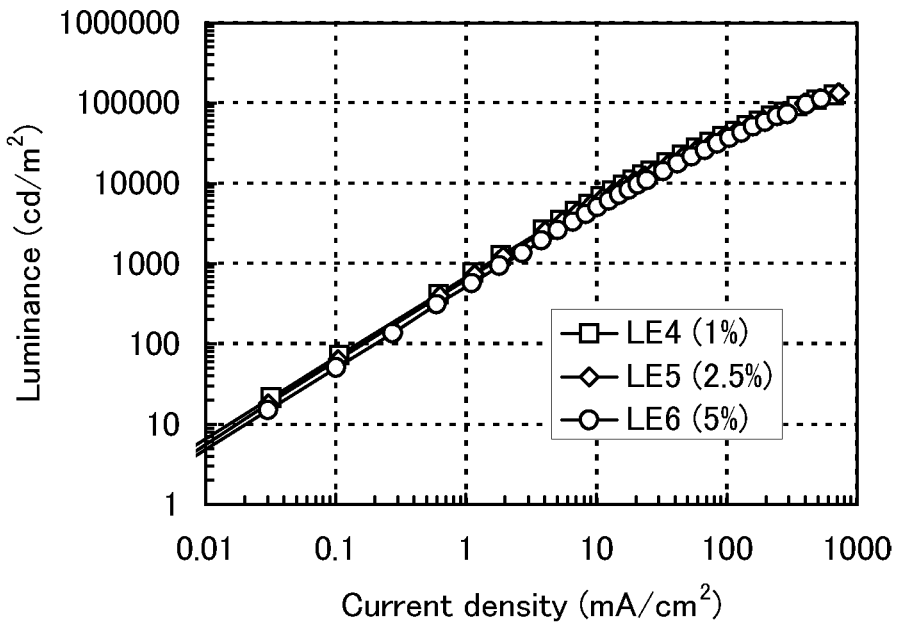
FIG. 12 shows luminance vs. current density plots of light-emitting elements in Example 4.
Figure 13:
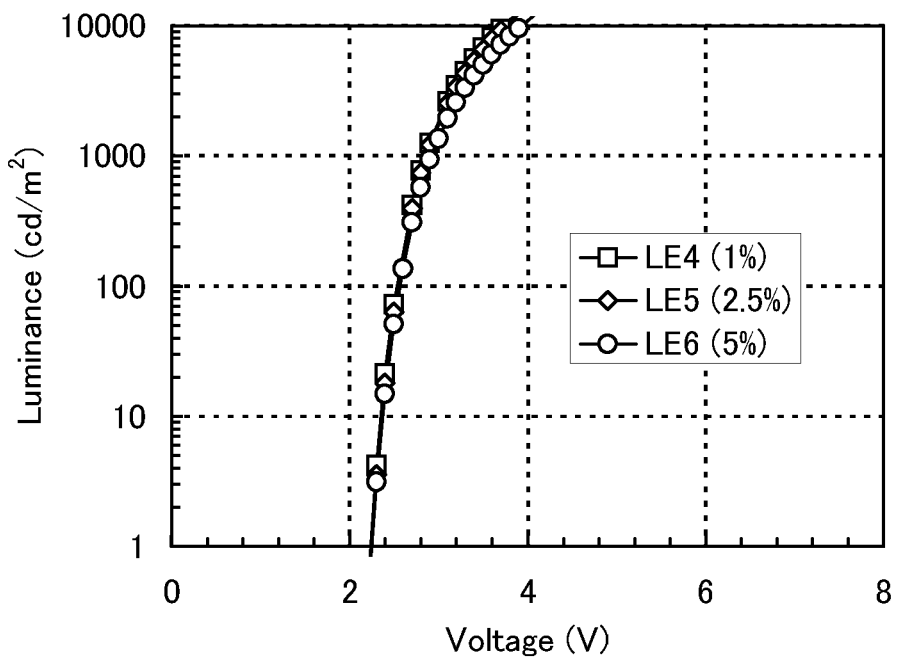
FIG. 13 shows luminance vs. voltage plots of the light-emitting elements in Example 4.
Figure 14:
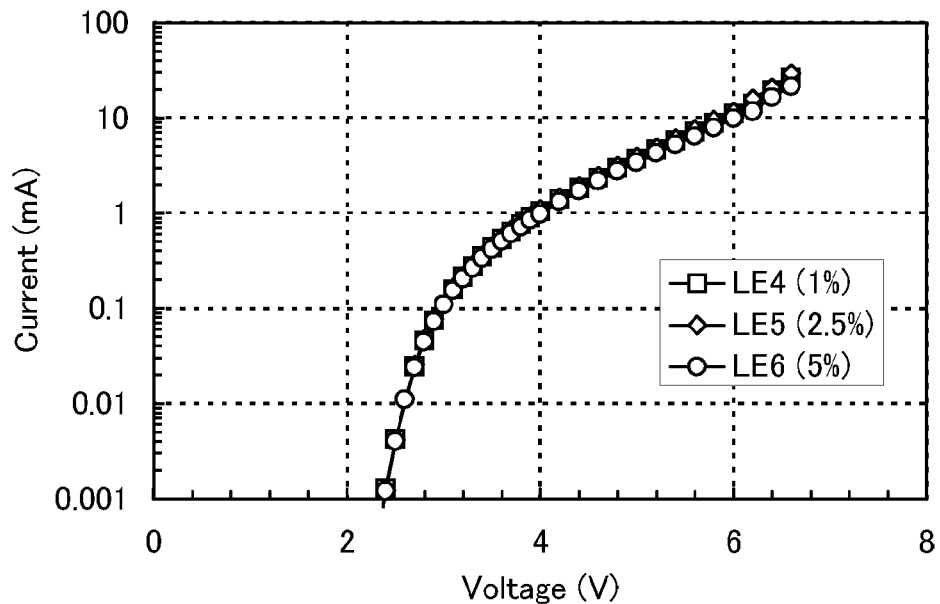
FIG. 14 shows current vs. voltage plots of the light-emitting elements in Example 4.
Figure 15:
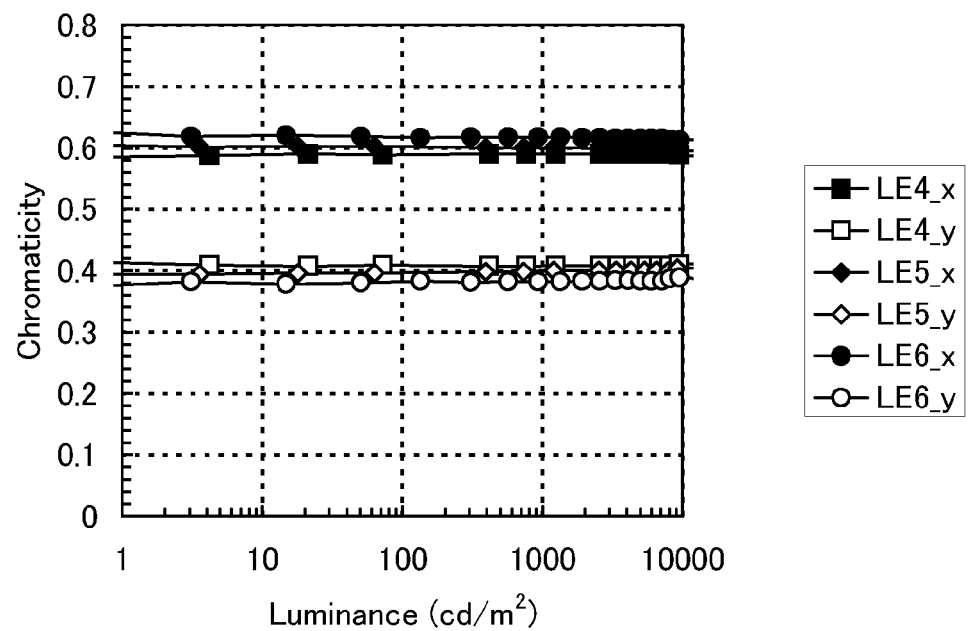
FIG. 15 shows chromaticity vs. luminance plots of the light-emitting elements in Example 4.

FIG. 12 shows luminance vs. current density plots of the light-emitting elements 4 to 6. In FIG. 12, the vertical axis represents luminance (cd/m$^2$), and the horizontal axis represents current density (mA/cm$^2$). FIG. 13 shows luminance vs. voltage plots of the light-emitting elements 4 to 6. In FIG. 13, the vertical axis represents luminance (cd/m$^2$), and the horizontal axis represents voltage (V). FIG. 14 shows current vs. voltage plots of the light-emitting elements 4 to 6. In FIG. 14, the vertical axis represents current (mA), and the horizontal axis represents voltage (V). FIG. 15 shows chromaticity vs. luminance plots of the light-emitting elements 4 to 6. In FIG. 15, the vertical axis represents chromaticity, and the horizontal axis represents luminance (cd/m$^2$).

Figure 16:
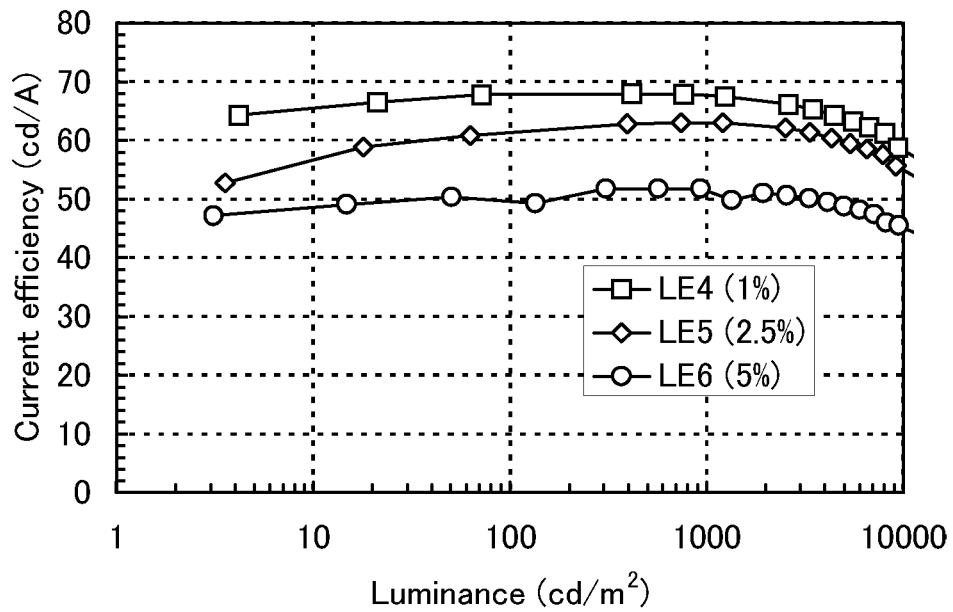
FIG. 16 shows current efficiency vs. luminance plots of the light-emitting elements in Example 4.
Figure 17:
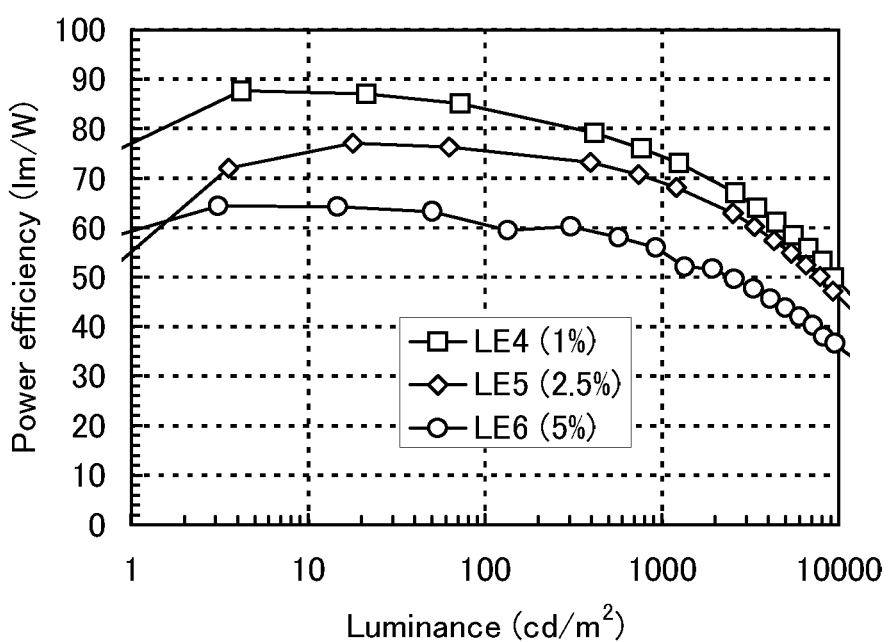
FIG. 17 shows power efficiency vs. luminance plots of the light-emitting elements in Example 4.
Figure 18:
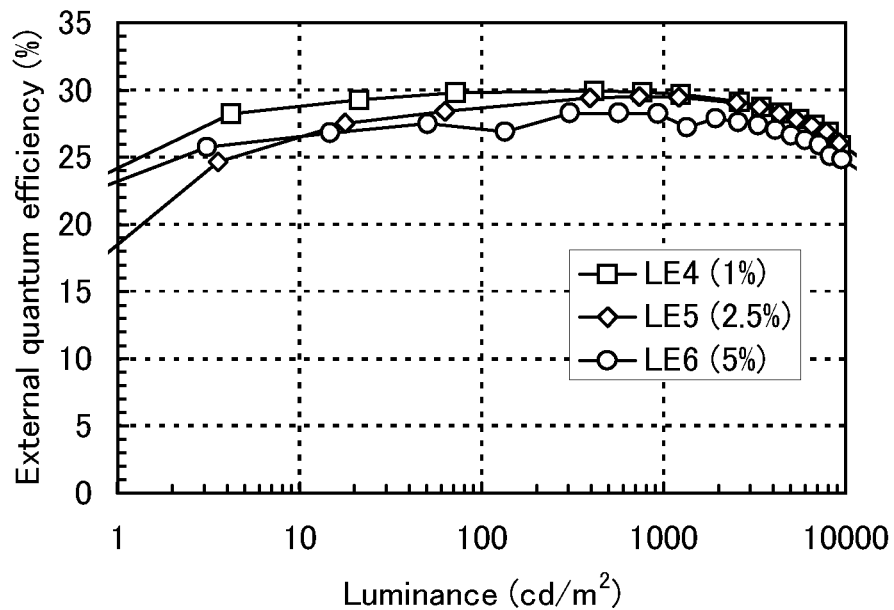
FIG. 18 shows external quantum efficiency vs. luminance plots of the light-emitting elements in Example 4.
Figure 19:
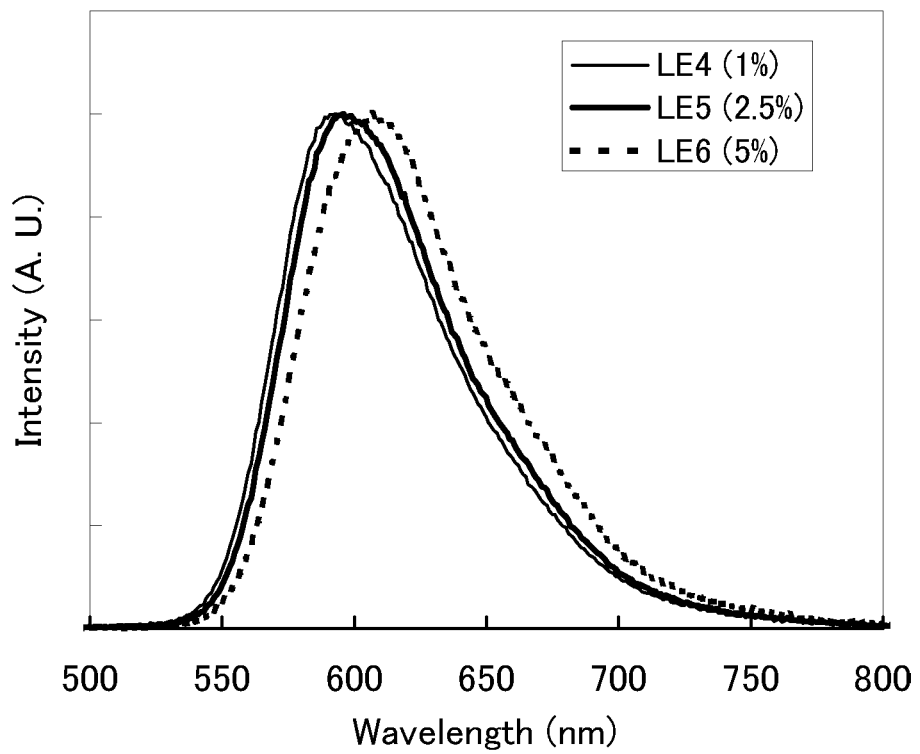
FIG. 19 shows emission spectra of the light-emitting elements in Example 4.

FIG. 16 shows current efficiency vs. luminance plots of the light-emitting elements 4 to 6. In FIG. 16, the vertical axis represents current efficiency (cd/A), and the horizontal axis represents luminance (cd/m$^2$). FIG. 17 shows power efficiency vs. luminance plots of the light-emitting elements 4 to 6. In FIG. 17, the vertical axis represents power efficiency (lm/W), and the horizontal axis represents luminance (cd/m$^2$). FIG. 18 shows external quantum efficiency vs. luminance plots of the light-emitting elements 4 to 6. In FIG. 18, the vertical axis represents external quantum efficiency (%), and the horizontal axis represents luminance (cd/m$^2$). FIG. 19 shows emission spectra of the light-emitting elements 4 to 6. In FIG. 19, the vertical axis represents emission intensity (arbitrary unit), and the horizontal axis represents wavelength (nm).

In FIG. 12 to FIG. 19, LE4, LE5, and LE6 represent the light-emitting element 4, the light-emitting element 5, and the light-emitting element 6, respectively.

According to FIG. 12 to FIG. 19, it is found that the light-emitting element 4 with a lower concentration of guests exhibits higher emission efficiency than the light-emitting element 5 and the light-emitting element 6. Table 5 shows main characteristics of the light-emitting element 4 to the light-emitting element 6. In Table 5, LE4, LE5, and LE6 represent the light-emitting element 4, the light-emitting element 5, and the light-emitting element 6, respectively. Table 5 reveals that the light-emitting element 4 in which the ratio of the weight of the guest to the total weight of the hosts is 1% can exhibit characteristics superior to those of the light-emitting element 5 and the light-emitting element 6 in which the ratio is higher than in the light-emitting element 4.

TABLE 5

|  | LE1 (1%) | LE2 (2.5%) | LE3 (5%) |
|---|---|---|---|
| Voltage (V) | 2.8 | 2.8 | 2.8 |
| Current density (mA/cm$^2$) | 1.13 | 1.92 | 1.80 |
| Chromaticity x | 0.5901 | 0.6004 | 0.6179 |
| Chromaticity y | 0.4079 | 0.3996 | 0.3821 |
| Luminance (cd/m$^2$) | 767.8 | 1209.0 | 931.6 |
| Current efficinecy (cd/A) | 67.78 | 62.92 | 51.68 |
| Power efficiency (lm/W) | 76.05 | 68.17 | 55.98 |
| External quantum efficiency (%) | 29.85 | 29.44 | 28.25 |

Example 5

In this example, in light-emitting elements, an organometallic complex serving as a phosphorescent compound, (acetylacetonato)bis(2-phenyldibenzo[f,h]quinoxalinato)iridium(III) (abbreviation: [Ir(dbq-P)$_2$(acac)]) was used as a guest, and the concentration of guests was changed. In this manner, the characteristics of the light-emitting elements were measured. A structure of [Ir(dbq-P)$_2$(acac)] is shown below.

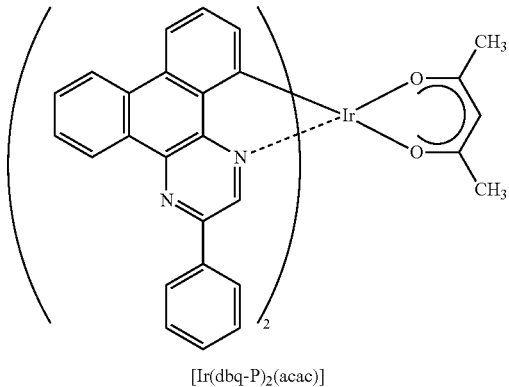

[Ir(dbq-P)$_2$(acac)]

The first organic compound used in this example was 2mDBTPDBq-II. The second organic compound used in this example was NPB. Note that the combination of 2mDBTPDBq-II and NPB forms an exciplex, similarly to the combination in Example 1 (2mDBTPDBq-II and PCBNBB), and the emission spectrum is located in substantially the same portion as that in Example 1.

In this example, a light-emitting element 7, a light-emitting element 8, and a light-emitting element 9 with different concentrations of guests were fabricated, and the characteristics thereof were compared. The structure of the light-emitting element 7, the light-emitting element 8, and the light-emitting element 9 is illustrated in FIG. 1A.

First, a glass substrate over which indium tin oxide including silicon (ITSO) with a thickness of 110 nm was formed as the first electrode 101 serving as an anode was prepared. A surface of the ITSO was covered with a polyimide film so that an area of 2 mm×2 mm of the surface was exposed. The electrode area was 2 mm×2 mm. As a pretreatment for forming the light-emitting element over the substrate, the surface of the substrate was washed with water and baked at 200° C. for one hour, and then a UV ozone treatment was performed for 370 seconds.

After that, the substrate was transferred into a vacuum evaporation apparatus whose pressure was reduced to about 10$^{-4}$ Pa, vacuum baking at 170° C. for 30 minutes was performed in a heating chamber of the vacuum evaporation apparatus, and then the substrate was cooled down for about 30 minutes. Then, the substrate was fixed to a holder provided in an evaporation chamber in the vacuum evaporation apparatus so that the surface provided with ITSO faced downward.

The pressure in the evaporation chamber was reduced to about 10$^{-4}$ Pa. Then, DBT3P-II and molybdenum(VI) oxide were co-evaporated to form the hole-injection layer 111 such that the weight ratio of DBT3P-II to molybdenum oxide was 4:2. The thickness of the hole-injection layer 111 was set to 40 nm.

Next, BPAFLP was deposited to a thickness of 20 nm by evaporation to form the hole-transport layer 112.

Over the hole-transport layer 112, 2mDBTPDBq-II, NPB, and [Ir(dbq-P)$_2$(acac)] were co-evaporated so that the weight ratio of 2mDBTPDBq-II to NPB and [Ir(dbq-P)$_2$(acac)] was 0.8:0.2:x to form the light-emitting layer 113 with a thickness of 40 nm. At this time, x was 0.01 in the case of the light-emitting element 7, x was 0.025 in the case of the light-emitting element 8, and x was 0.05 in the case of the light-emitting element 9.

Next, 2mDBTPDBq-II was deposited to a thickness of 10 nm by evaporation and then BPhen was deposited to a thickness of 20 nm by evaporation, so that the electron-transport layer 114 was formed. Further, lithium fluoride was deposited to a thickness of 1 nm over the electron-transport layer 114 by evaporation, so that the electron-injection layer 115 was formed. In this manner, the EL layer 102 was formed. Note that in the above evaporation process, evaporation was all performed by a resistance heating method.

Finally, aluminum was formed to be 200 nm thick as the second electrode 103 serving as a cathode, whereby a light-emitting element was fabricated. Table 6 shows a stacked structure of the light-emitting element. In Table 6, x was 0.01 in the case of the light-emitting element 7, x was 0.025 in the case of the light-emitting element 8, and x was 0.05 in the case of the light-emitting element 9.

TABLE 6

|  | Light-emitting elements 7 to 9 |
|---|---|
| First electrode | ITSO, 110 nm |
| Hole-injection layer | DBT3P-II:MoOx (=4:2), 40 nm |
| Hole-transport layer | BPAFLP, 20 nm |
| Light-emitting layer | 2mDBTPDBq-II:NPB:[Ir(dbq-P)$_2$(acac)] (=0.8:0.2:x), 40 nm |
| Electron-transport layer | 2mDBTPDBq-II, 10 nm BPhen, 20 nm |
| Electron-injection layer | LiF, 1 nm |
| Second electrode | Al, 200 nm |

The thusly fabricated light-emitting elements (the light-emitting elements 7 to 9) were sealed in a glove box under a nitrogen atmosphere (sealing by heat treatment at 80° C. for one hour) without being exposed to atmospheric air. Then, the operating characteristics of the light-emitting elements were measured. Note that the measurement was carried out at room temperature (in an atmosphere kept at 25° C.).

Figure 20:
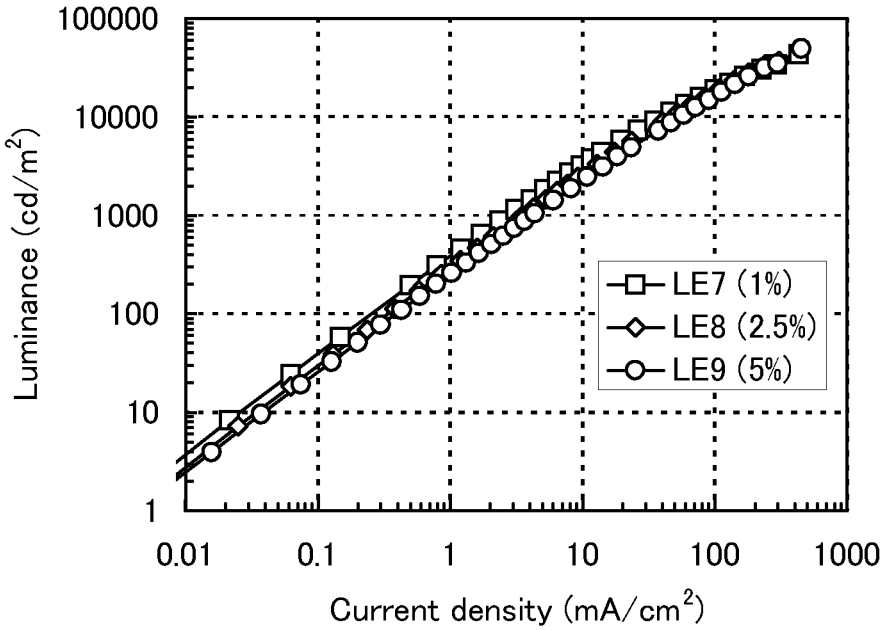
FIG. 20 shows luminance vs. current density plots of light-emitting elements in Example 5.
Figure 21:
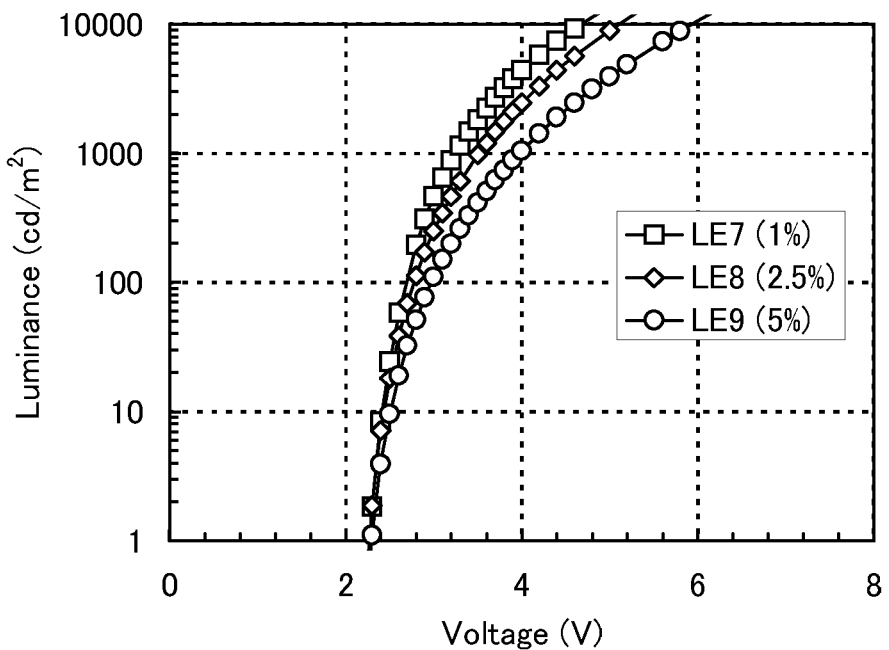
FIG. 21 shows luminance vs. voltage plots of the light-emitting elements in Example 5.
Figure 22:
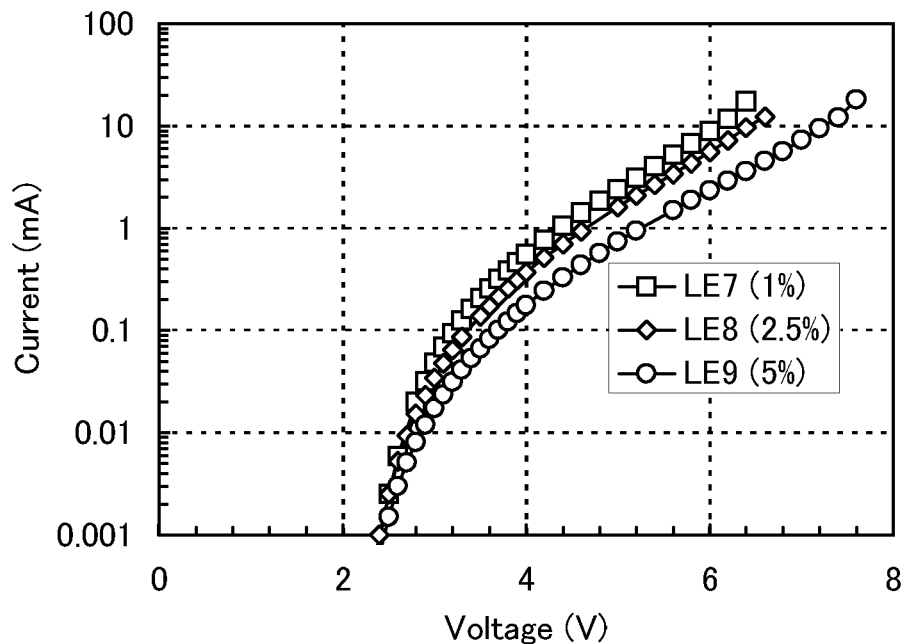
FIG. 22 shows current vs. voltage plots of the light-emitting elements in Example 5.
Figure 23:
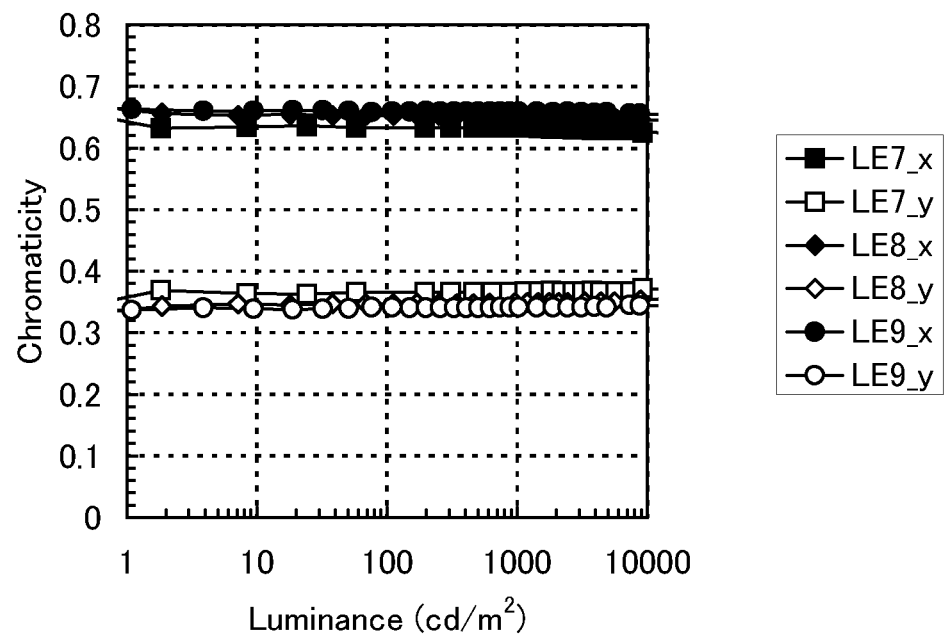
FIG. 23 shows chromaticity vs. luminance plots of the light-emitting elements in Example 5.

FIG. 20 shows luminance vs. current density plots of the light-emitting elements 7 to 9. In FIG. 20, the vertical axis represents luminance (cd/m$^2$), and the horizontal axis represents current density (mA/cm$^2$). FIG. 21 shows luminance vs. voltage plots of the light-emitting elements 7 to 9. In FIG. 21, the vertical axis represents luminance (cd/m$^2$), and the horizontal axis represents voltage (V). FIG. 22 shows current vs. voltage plots of the light-emitting elements 7 to 9. In FIG. 22, the vertical axis represents current (mA), and the horizontal axis represents voltage (V). FIG. 23 shows chromaticity vs. luminance plots of the light-emitting elements 7 to 9. In FIG. 23, the vertical axis represents chromaticity, and the horizontal axis represents luminance (cd/m$^2$).

Figure 26:
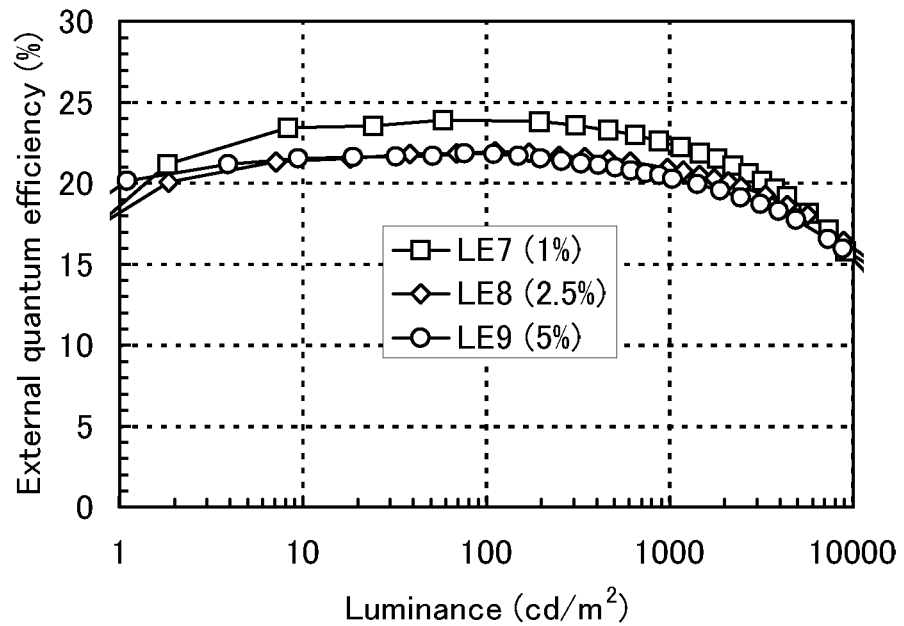
FIG. 26 shows external quantum efficiency vs. luminance plots of the light-emitting elements in Example 5.
Figure 27:
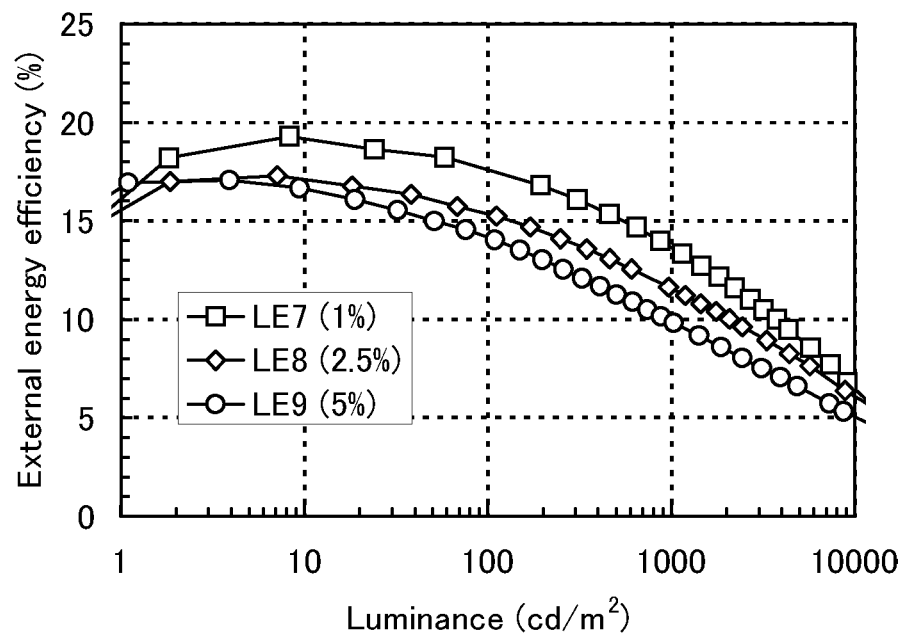
FIG. 27 shows external energy efficiency vs. luminance plots of the light-emitting elements in Example 5.
Figure 28:
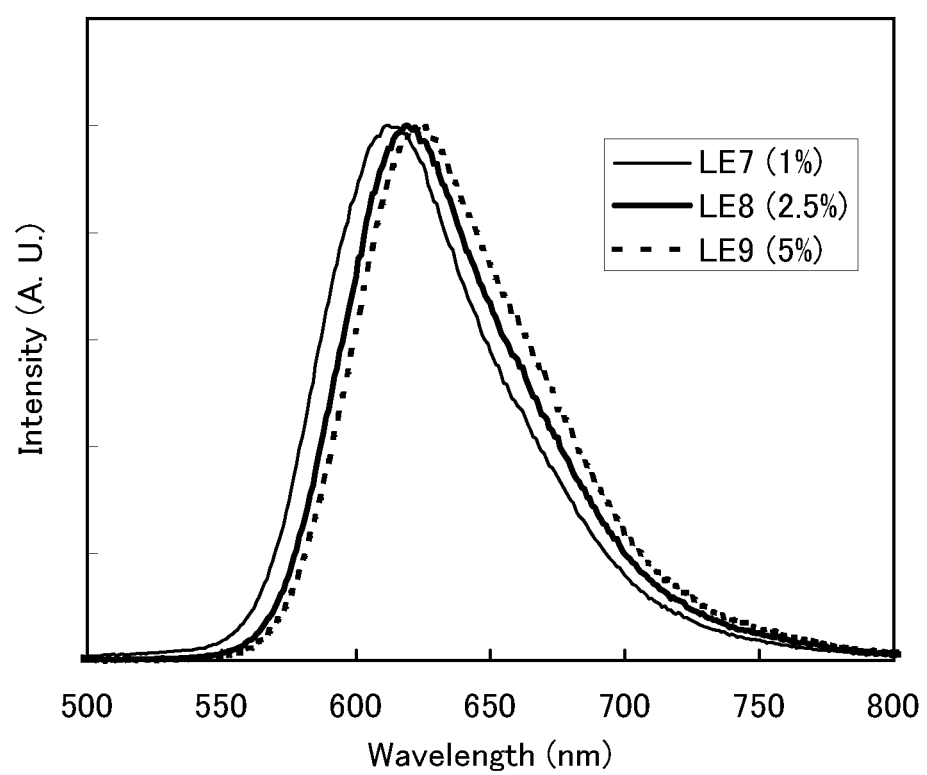
FIG. 28 shows emission spectra of the light-emitting elements in Example 5.

FIG. 24 shows current efficiency vs. luminance plots of the light-emitting elements 7 to 9. In FIG. 24, the vertical axis represents current efficiency (cd/A), and the horizontal axis represents luminance (cd/m$^2$). FIG. 25 shows power efficiency vs. luminance plots of the light-emitting elements 7 to 9. In FIG. 25, the vertical axis represents power efficiency (lm/W), and the horizontal axis represents luminance (cd/m$^2$). FIG. 26 shows external quantum efficiency vs. luminance plots of the light-emitting elements 7 to 9. In FIG. 26, the vertical axis represents external quantum efficiency (%), and the horizontal axis represents luminance (cd/m$^2$). FIG. 27 shows external energy efficiency vs. luminance plots of the light-emitting elements 7 to 9. In FIG. 27, the vertical axis represents external energy efficiency (%), and the horizontal axis represents luminance (cd/m$^2$). FIG. 28 shows emission spectra of the light-emitting elements 7 to 9. In FIG. 28, the vertical axis represents emission intensity (arbitrary unit), and the horizontal axis represents wavelength (nm).

In FIG. 20 to FIG. 28, LE7, LE8, and LE9 represent the light-emitting element 7, the light-emitting element 8, and the light-emitting element 9, respectively.

According to FIG. 20 to FIG. 28, it is found that the light-emitting element 7 with a lower concentration of guests exhibits higher emission efficiency than the light-emitting element 8 and the light-emitting element 9. Table 7 shows main characteristics of the light-emitting element 7 to the light-emitting element 9. In Table 7, LE7, LE8, and LE9 represent the light-emitting element 7, the light-emitting element 8, and the light-emitting element 9, respectively. Table 7 reveals that the light-emitting element 7 in which the ratio of the weight of the guest to the total weight of the hosts is 1% can exhibit characteristics superior to those of the light-emitting element 8, and the light-emitting element 9 in which the ratio is higher than in the light-emitting element 7.

TABLE 7

|  | LE1 (1%) | LE2 (2.5%) | LE3 (5%) |
|---|---|---|---|
| Voltage (V) | 3.2 | 3.5 | 4.0 |
| Current density (mA/cm$^2$) | 2.35 | 3.45 | 4.36 |
| Chromaticity x | 0.6331 | 0.6508 | 0.6591 |
| Chromaticity y | 0.3655 | 0.3492 | 0.3409 |
| Luminance (cd/m$^2$) | 874.0 | 969.9 | 1037.0 |
| Current efficinecy (cd/A) | 37.17 | 28.13 | 23.79 |
| Power efficiency (lm/W) | 36.46 | 25.25 | 18.69 |
| External quantum efficiency (%) | 22.59 | 20.94 | 20.27 |
| Energy efficiency (%) | 13.97 | 11.66 | 9.80 |

This application is based on Japanese Patent Application serial no. 2011-085423 filed with Japan Patent Office on Apr. 7, 2011, the entire contents of which are hereby incorporated by reference.

EXPLANATION OF REFERENCE

101: first electrode, 102: EL layer, 103: second electrode, 104: first EL layer, 105: second EL layer, 106: charge generation layer, 111: hole-injection layer, 112: hole-transport layer, 113: light-emitting layer, 114: electron-transport layer, 115: electron-injection layer, 116: electron-injection buffer layer, 117: electron-relay layer, 118: composite material layer.

The invention claimed is:

1. A light-emitting element comprising:
   a pair of electrodes; and
   a light-emitting layer between the pair of electrodes, the light-emitting layer comprising:
      a phosphorescent compound;
      a first organic compound; and
      a second organic compound,
   wherein the first organic compound and the second organic compound are selected so as to form an exciplex,
   wherein an emission spectrum of the exciplex overlaps with an absorption band of the phosphorescent compound, and
   wherein a weight ratio of the phosphorescent compound to a total of the first organic compound and the second organic compound is from 0.1% to 2.5%.

2. The light-emitting element according to claim 1, wherein the exciplex is formed by an interaction of a singlet exciton of the first organic compound with the second organic compound which is in a ground state.

3. The light-emitting element according to claim 1, wherein the exciplex is formed from an anion of the first organic compound and a cation of the second organic compound.

4. The light-emitting element according to claim 1, wherein excitation energy of the exciplex is transferred into the phosphorescent compound so that the phosphorescent compound emits phosphorescence.

5. The light-emitting element according to claim 1, wherein at least one of the first organic compound and the second organic compound is a fluorescent compound.

6. The light-emitting element according to claim 1, wherein the phosphorescent compound is an organometallic complex.

7. The light-emitting element according to claim 6, wherein the phosphorescent compound includes iridium.

8. The light-emitting element according to claim 1, wherein a molar absorption coefficient of the phosphorescent compound at a peak wavelength of the emission spectrum of the exciplex is 5000 M$^{-1}$cm$^{-1}$ or more.

9. An electronic device comprising the light-emitting element according to claim 1.

10. A lighting device comprising the light-emitting element according to claim 1.

11. The light-emitting element according to claim 1, wherein the first organic compound and the second organic compound are different organic compounds.

12. A light-emitting element comprising:
   a pair of electrodes; and
   an EL layer between the pair of electrodes, the EL layer comprising:
      a hole-injection layer;
      a hole-transport layer over the hole-injection layer;
      a light-emitting layer comprising a phosphorescent compound, a first organic compound, and a second organic compound, over the hole-transport layer;
      an electron-transport layer over the light-emitting layer; and
      an electron-injection layer over the electron-transport layer,
   wherein the first organic compound and the second organic compound are selected so as to form an exciplex, wherein an emission spectrum of the exciplex overlaps with an absorption band of the phosphorescent compound, and wherein a weight ratio of the phosphorescent compound to a total of the first organic compound and the second organic compound is from 0.1% to 2.5%.

13. The light-emitting element according to claim 12, wherein the exciplex is formed by an interaction of a singlet exciton of the first organic compound with the second organic compound which is in a ground state.

14. The light-emitting element according to claim 12, wherein the exciplex is formed from an anion of the first organic compound and a cation of the second organic compound.

15. The light-emitting element according to claim 12, wherein excitation energy of the exciplex is transferred into the phosphorescent compound so that the phosphorescent compound emits phosphorescence.

16. The light-emitting element according to claim 12, wherein at least one of the first organic compound and the second organic compound is a fluorescent compound.

17. The light-emitting element according to claim 12, wherein the phosphorescent compound is an organometallic complex.

18. The light-emitting element according to claim 17, wherein the phosphorescent compound includes iridium.

19. The light-emitting element according to claim 12, wherein a molar absorption coefficient of the phosphorescent compound at a peak wavelength of the emission spectrum of the exciplex is 5000 $M^{-1}\ cm^{-1}$ or more.

20. An electronic device comprising the light-emitting element according to claim 12.

21. A lighting device comprising the light-emitting element according to claim 12.

22. The light-emitting element according to claim 12, wherein the first organic compound and the second organic compound are different organic compounds.

23. A light-emitting element comprising:
a pair of electrodes;
a first EL layer;
a second EL layer; and
a charge-generation layer between the first EL layer and the second EL layer,
wherein the first EL layer, the second EL layer, and the charge-generation layer are stacked between the pair of electrodes, wherein one of the first EL layer and the second EL layer comprises a phosphorescent compound, a first organic compound, and a second organic compound, wherein the first organic compound and the second organic compound are selected so as to form an exciplex, wherein an emission spectrum of the exciplex overlaps with an absorption band of the phosphorescent compound, and wherein a weight ratio of the phosphorescent compound to a total of the first organic compound and the second organic compound is from 0.1% to 2.5%.

24. The light-emitting element according to claim 23, wherein the exciplex is formed by an interaction of a singlet exciton of the first organic compound with the second organic compound which is in a ground state.

25. The light-emitting element according to claim 23, wherein the exciplex is formed from an anion of the first organic compound and a cation of the second organic compound.

26. The light-emitting element according to claim 23, wherein excitation energy of the exciplex is transferred into the phosphorescent compound so that the phosphorescent compound emits phosphorescence.

27. The light-emitting element according to claim 23, wherein at least one of the first organic compound and the second organic compound is a fluorescent compound.

28. The light-emitting element according to claim 23, wherein the phosphorescent compound is an organometallic complex.

29. The light-emitting element according to claim 28, wherein the phosphorescent compound includes iridium.

30. The light-emitting element according to claim 23, wherein a molar absorption coefficient of the phosphorescent compound at a peak wavelength of the emission spectrum of the exciplex is 5000 $M^{-1}cm^{-1}$ or more.

31. An electronic device comprising the light-emitting element according to claim 23.

32. A lighting device comprising the light-emitting element according to claim 23.

33. The light-emitting element according to claim 23, wherein the first organic compound and the second organic compound are different organic compounds.

* * * * *